(12) United States Patent
Mikado et al.

(10) Patent No.: US 10,312,171 B2
(45) Date of Patent: Jun. 4, 2019

(54) SEMICONDUCTOR DEVICE

(71) Applicant: ROHM CO., LTD., Kyoto-shi, Kyoto (JP)

(72) Inventors: Kensuke Mikado, Kyoto (JP); Makoto Shibuya, Kyoto (JP); Yasufumi Matsuoka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/827,946

(22) Filed: Nov. 30, 2017

(65) Prior Publication Data

US 2018/0096908 A1    Apr. 5, 2018

Related U.S. Application Data

(63) Continuation of application No. 15/269,633, filed on Sep. 19, 2016, now Pat. No. 9,859,182, which is a
(Continued)

(30) Foreign Application Priority Data

| Apr. 16, 2013 | (JP) | 2013-085388 |
| Apr. 18, 2013 | (JP) | 2013-087290 |
| Mar. 17, 2014 | (JP) | 2014-053471 |

(51) Int. Cl.
    *H01L 21/56*      (2006.01)
    *H01L 23/00*      (2006.01)
(Continued)

(52) U.S. Cl.
CPC .......... *H01L 23/293* (2013.01); *H01L 21/568* (2013.01); *H01L 23/28* (2013.01);
(Continued)

(58) Field of Classification Search
CPC ......... H01L 23/49503; H01L 23/49648; H01L 23/49513; H01L 23/3107; H01L 23/495;
(Continued)

(56) References Cited

U.S. PATENT DOCUMENTS

| 6,198,171 B1 | 3/2001 | Huang |
| 6,548,328 B1 * | 4/2003 | Sakamoto et al. .......................... H01L 23/49503 257/670 |

(Continued)

FOREIGN PATENT DOCUMENTS

| JP | 54-113250 A | 9/1979 |
| JP | 5-166984 | 7/1993 |

(Continued)

OTHER PUBLICATIONS

Office Action issued in the corresponding Japanese Patent application, dated Oct. 3, 2017, and corresponding English machine translation.

(Continued)

*Primary Examiner* — Jasmine J Clark
(74) *Attorney, Agent, or Firm* — Hamre, Schumann, Mueller & Larson, P.C.

(57) ABSTRACT

The semiconductor device includes a semiconductor element, a main lead and a resin package. The semiconductor element includes an obverse surface and a reverse surface spaced apart from each other in a thickness direction. The main lead supports the semiconductor element via the reverse surface of the semiconductor element. The resin package covers the entirety of the semiconductor element. The resin package covers the main lead in such a manner that a part of the main lead is exposed from the resin
(Continued)

package. The semiconductor element includes a part that does not overlap the main lead as viewed in the thickness direction.

32 Claims, 35 Drawing Sheets

Related U.S. Application Data continuation of application No. 14/958,200, filed on Dec. 3, 2015, now Pat. No. 9,490,194, which is a continuation of application No. 14/253,421, filed on Apr. 15, 2014, now Pat. No. 9,236,317.

(51) Int. Cl.
| | | |
|---|---|---|
| *H01L 23/28* | (2006.01) | |
| *H01L 23/29* | (2006.01) | |
| *H01L 23/31* | (2006.01) | |
| *H01L 23/492* | (2006.01) | |
| *H01L 23/495* | (2006.01) | |

(52) U.S. Cl.
CPC ...... *H01L 23/3107* (2013.01); *H01L 23/3192* (2013.01); *H01L 23/492* (2013.01); *H01L 23/4951* (2013.01); *H01L 23/4952* (2013.01); *H01L 23/49503* (2013.01); *H01L 23/49513* (2013.01); *H01L 23/49524* (2013.01); *H01L 23/49548* (2013.01); *H01L 23/49562* (2013.01); *H01L 24/32* (2013.01); *H01L 24/48* (2013.01); *H01L 24/73* (2013.01); *H01L 24/45* (2013.01); *H01L 2224/05552* (2013.01); *H01L 2224/05553* (2013.01); *H01L 2224/0603* (2013.01); *H01L 2224/32245* (2013.01); *H01L 2224/45015* (2013.01); *H01L 2224/4554* (2013.01); *H01L 2224/45144* (2013.01); *H01L 2224/48091* (2013.01); *H01L 2224/48106* (2013.01); *H01L 2224/48247* (2013.01); *H01L 2224/48471* (2013.01); *H01L 2224/48479* (2013.01); *H01L 2224/73265* (2013.01); *H01L 2224/78301* (2013.01); *H01L 2224/85051* (2013.01); *H01L 2224/85186* (2013.01); *H01L 2924/00014* (2013.01); *H01L 2924/13091* (2013.01); *H01L 2924/181* (2013.01); *H01L 2924/20752* (2013.01)

(58) Field of Classification Search
CPC ........... H01L 23/49575; H01L 23/4951; H01L 23/49548; H01L 23/49524; H01L 23/4952; H01L 23/49562; H01L 2924/20752; H01L 24/73; H01L 2924/00014; H01L 2924/13091; H01L 2224/73265; H01L 23/28; H01L 2224/48479; H01L 2224/48471; H01L 2224/48247; H01L 24/45
See application file for complete search history.

(56) References Cited

U.S. PATENT DOCUMENTS

| | | | |
|---|---|---|---|
| 6,559,525 B2 | 5/2003 | Huang | |
| 6,642,609 B1 | 11/2003 | Minamio et al. | |
| 6,730,544 B1 | 5/2004 | Yang | |
| 7,556,987 B2* | 7/2009 | Dimaano, Jr. | H01L 21/4828 257/669 |
| 7,993,980 B2 | 8/2011 | Fukuda et al. | |
| 8,928,136 B2* | 1/2015 | Watanabe | H01L 23/49548 257/676 |
| 9,236,317 B2* | 1/2016 | Mikado | H01L 23/28 |
| 2006/0255438 A1 | 11/2006 | Omori | |
| 2007/0063320 A1* | 3/2007 | Punzalan | H01L 21/4828 257/666 |
| 2012/0091571 A1 | 4/2012 | Koga et al. | |
| 2014/0124912 A1* | 5/2014 | Kaneda | H01L 23/4952 257/676 |

FOREIGN PATENT DOCUMENTS

| | | |
|---|---|---|
| JP | 5-326601 | 12/1993 |
| JP | 2001-28420 A | 1/2001 |
| JP | 2002-83918 A | 3/2002 |
| JP | 2002-222906 A | 8/2002 |
| JP | 2004-179303 | 6/2004 |
| JP | 2005-19633 | 1/2005 |
| JP | 2005-159103 A | 6/2005 |
| JP | 2005-209770 A | 8/2005 |
| JP | 2005-353700 | 12/2005 |
| JP | 2010-123908 | 6/2010 |
| JP | 2010-171271 | 8/2010 |
| JP | 2012-190936 | 10/2012 |
| WO | 2010/131706 A1 | 11/2010 |

OTHER PUBLICATIONS

Office Action received in the corresponding Japanese Patent application, dated Feb. 5, 2019, and corresponding machine translation (12 pages).

* cited by examiner

SEMICONDUCTOR DEVICE

BACKGROUND OF THE INVENTION

1. Field of the Invention

The present invention relates to a package type semiconductor device.

2. Description of the Related Art

Conventionally, a semiconductor device having a semiconductor element sealed in a resin package has been proposed. For instance, the semiconductor device disclosed in JP2012-190936A includes a semiconductor element, three leads, three wires and a resin package. The semiconductor element is placed on a mount surface of a main lead (one of the three leads). The semiconductor element has a surface on which three electrodes are formed. These electrodes are connected to the three leads via the three wires, respectively. The resin package covers the entirety of the semiconductor element, all of the three wires, and a part of each of the three leads. Each of the three leads has a part (terminal) projecting from the resin package.

In the conventional semiconductor device, the size of main lead is larger than that of the semiconductor element. Since the resin package covers the entirety of the main lead, the resin package is undesirably large relative to the semiconductor element, which hinders size reduction of the semiconductor device.

SUMMARY OF THE INVENTION

The present invention has been conceived under the circumstances described above. It is therefore an object of the present invention to provide a semiconductor device suitable for size reduction.

A semiconductor device provided according to a first aspect of the present invention includes a semiconductor element including an obverse surface and a reverse surface spaced apart from each other in a thickness direction, a main lead supporting the semiconductor element via the reverse surface, and a resin package covering the semiconductor element and the main lead. The main lead is exposed from resin package. The semiconductor element includes a part that does not overlap the main lead as viewed in the thickness direction.

A semiconductor device provided according to a first aspect of the present invention includes a semiconductor element, a first and a second bumps, a main lead, a first and a second wires, a first and a second subleads and a resin package.

The semiconductor element includes an obverse surface and a reverse surface spaced apart from each other in a thickness direction, a first obverse surface electrode and a second obverse surface electrode formed on the obverse surface, and a reverse surface electrode formed on the reverse surface. The first bump and the second bump are formed on the first obverse surface electrode and the second obverse surface electrode, respectively. The main lead includes a die pad to which the reverse surface electrode is electrically connected and a main-lead reverse surface terminal arranged on the opposite side of the die pad. The first sublead includes a first wire bonding portion connected to the first obverse surface electrode via the first wire and a first sublead reverse surface terminal provided on the opposite side of the first wire bonding portion. The second sublead includes a second wire bonding portion connected to the second obverse surface electrode via the second wire and a second sublead reverse surface terminal provided on the opposite side of the second wire bonding portion. The resin package covers the semiconductor element and a part of each of the main lead, the first sublead and the second sublead. The resin package has a common surface from which the main lead reverse surface terminal, the first sublead reverse surface terminal and the second sublead reverse terminal are exposed. The exposed surfaces of the main lead reverse surface terminal, the first sublead reverse surface terminal and the second sublead reverse terminal face in the same direction.

According to the second aspect of the present invention, the main lead includes a main-lead full-thickness portion extending from the die pad to the main-lead reverse surface terminal and a main-lead eaved portion projecting from the main-lead full-thickness portion in a direction perpendicular to the thickness direction. The die pad and the semiconductor element overlap both of the main-lead full-thickness portion and the main-lead eaved portion as viewed in the thickness direction. At least one of the first obverse surface electrode and the second obverse surface electrode overlaps the main-lead eaved portion. The first wire includes a first bonding portion bonded to the first wire bonding portion and a second bonding portion bonded to the first obverse surface electrode via the first bump. The second wire includes a first bonding portion bonded to the second wire bonding portion and a second bonding portion bonded to the second obverse surface electrode via the second bump.

Other features and advantages of the present invention will become more apparent from detailed description given below with reference to the accompanying drawings.

DESCRIPTION OF THE PREFERRED EMBODIMENTS

Embodiments of the present invention are described below with reference to the accompanying drawings.

A semiconductor device according to a first embodiment of the present invention is described below with reference to FIGS. 1-11.

Figure 1:
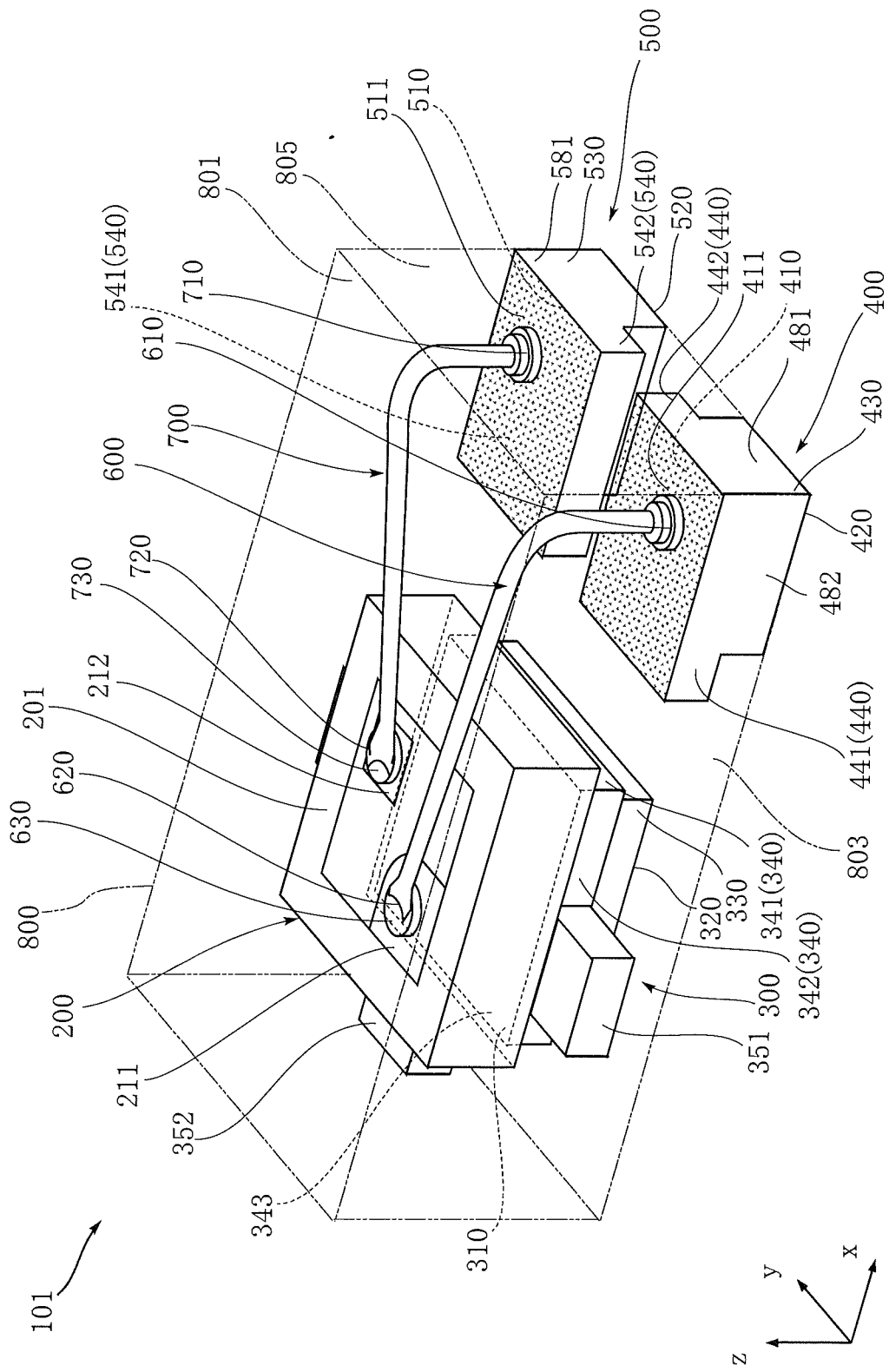
FIG. 1 is a perspective view illustrating a semiconductor device according to a first embodiment of the present invention.
Figure 2:
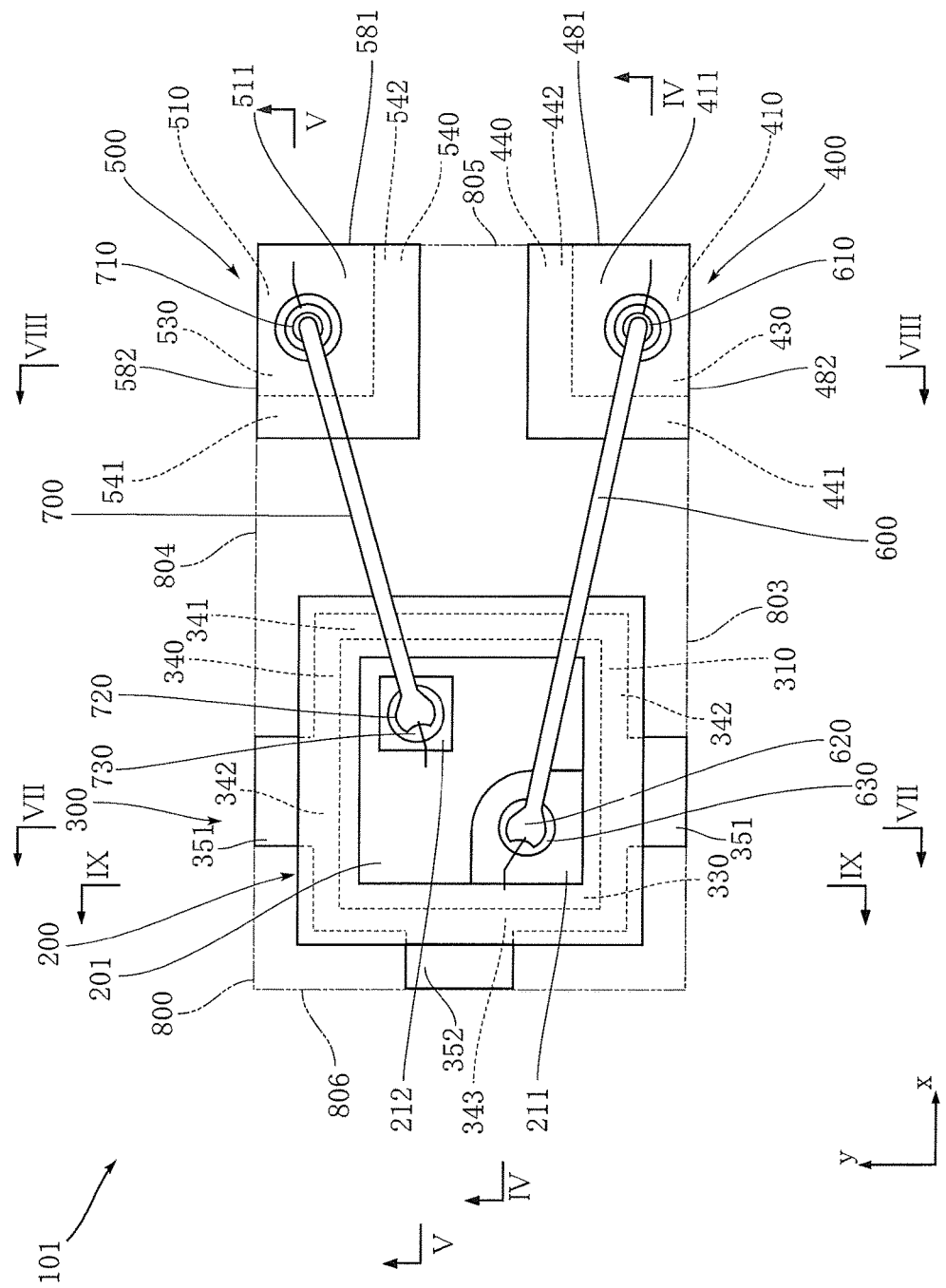
FIG. 2 is a plan view illustrating the semiconductor device of the first embodiment.

The illustrated semiconductor device 101 includes a semiconductor element 200, a main lead 300, a first sublead 400, a second sublead 500, a first wire 600, a second wire 700 and a resin package 800. In FIGS. 1 and 2, the resin package 800 is indicated by double-dashed lines. The semiconductor device 101 is configured as a relatively small device that can be surface-mounted. For instance, the semiconductor device 101 is about 0.4-0.8 mm in dimension in the direction x, about 0.2-0.6 mm in dimension in the direction y and about 0.3-0.4 mm in dimension in the direction z.

In the illustrated example, the semiconductor element 200 is configured as a transistor. However, the present invention is not limited to this. For instance, a diode may be used as the semiconductor element of the semiconductor device of the present invention.

The semiconductor element 200 includes an element body having an obverse surface 201 and a reverse surface 202, a first obverse surface electrode 211, a second obverse surface electrode 212 and a reverse surface electrode 220. The obverse surface 201 and the reverse surface 202 are spaced apart from each other in the direction z (thickness direction) and face in mutually opposite directions. For instance, the semiconductor element 200 is about 300 μm in dimension in the direction x and about 300 μm in dimension in the direction y.

Figure 14:
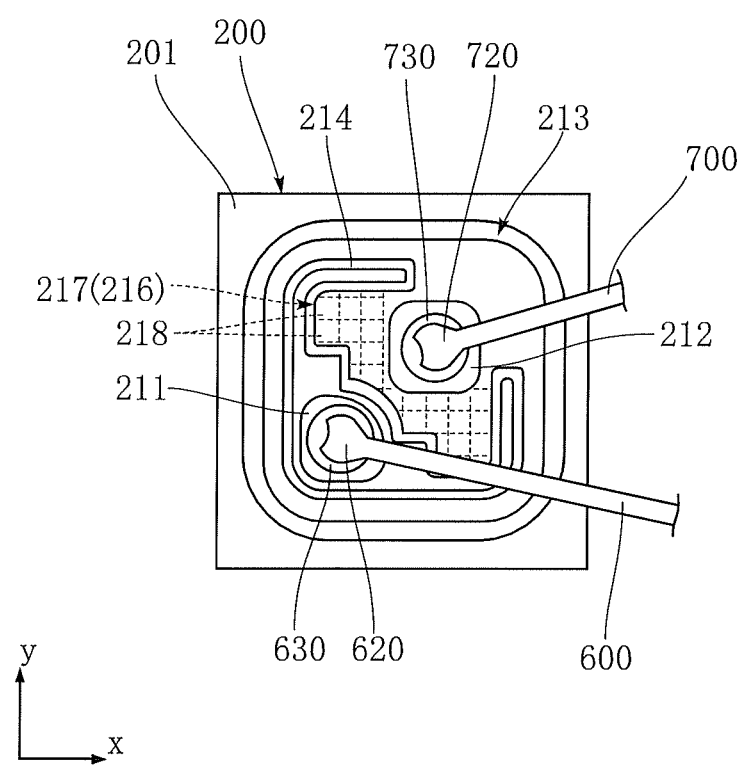
FIG. 14 is a plan view illustrating apart of a semiconductor element of the first embodiment.

As shown in FIG. 14, the first obverse surface electrode 211 and the second obverse surface electrode 212 are formed on the obverse surface 201 of the element body. Specifically, the obverse surface 201 is formed with an electrode layer 213. Each of the first obverse surface electrode 211 and the second obverse surface electrode 212 comprises a part of the electrode layer 213. For instance, the electrode layer 213 comprises an Au-plated layer.

In this embodiment, the first obverse surface electrode 211 is a gate electrode, whereas the second obverse surface electrode 212 is a source electrode. In the direction x, the first obverse surface electrode 211 is positioned on the left of the second obverse surface electrode 212. (Or, the second obverse surface electrode 212 is positioned on the right of the first obverse surface electrode 211.) In the direction y, the first obverse surface electrode 211 is positioned on the lower side of the second obverse surface electrode 212. (Or, the second obverse surface electrode 212 is positioned on the upper side of the first obverse surface electrode 211.) The reverse surface electrode 220 is formed on the reverse surface 202 of the element body. In this embodiment, the reverse surface electrode 220 is a drain electrode.

A removal region 214 is formed by removing a part of the electrode layer 213 formed on the obverse surface 201. The removal region 214 surrounds the first obverse surface electrode 211. Specifically, as illustrated in FIG. 14, the removal region 214 includes two portions extending parallel to the upper edge of the semiconductor element 200 (and a connecting portion that connects the right ends of these portions to each other), two portions extending parallel to the right edge of the semiconductor element 200 (and a connecting portion that connects the upper ends of these portions to each other), and two portions sandwiching the first obverse surface electrode 211 in the neighborhood of the electrode. With these portions connected to each other, the removal region 214 surrounds the first obverse surface electrode 211 without a break. The continuously extending removal region 214 provides insulation between the first obverse surface electrode 211 and the second obverse surface electrode 212.

An active region 216 is provided adjacent to the second obverse surface electrode 212. MOSFET 217 is built in the active region 216. Specifically, the MOSFET 217 is formed inside the element body (i.e., in the inner portion spaced apart from the obverse surface 201 in the direction z) and is made up of a plurality of unit cells 218. In the example illustrated in FIG. 14, the unit cells 218 are arranged in a matrix (i.e., the unit cells are aligned in the vertical direction and the horizontal direction). However, the present invention is not limited to this, and the unit cells may be arranged in other manners. For instance, the unit cells may be arranged in rows or columns or in a staggered manner.

Although only the second obverse surface electrode 212 is provided as the source electrode in this embodiment, the present invention is not limited to this. For instance, a plurality of source electrodes may be provided.

Figure 3:
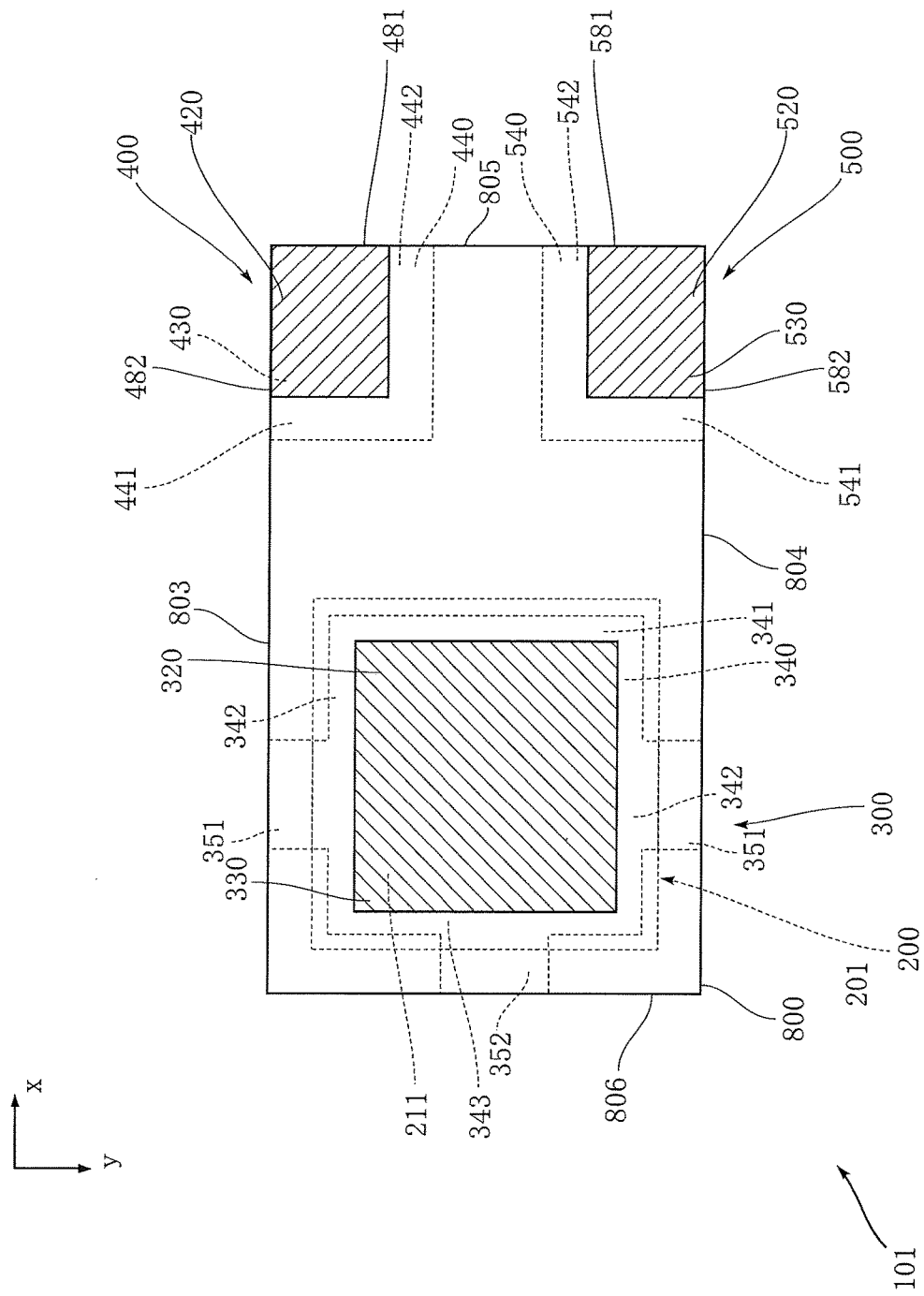
FIG. 3 is a bottom view of the semiconductor device of the first embodiment.

The semiconductor element 200 is arranged on the main lead 300. As illustrated in FIGS. 2 and 3, as viewed in the thickness direction z, the semiconductor element 200 has portions that do not overlap the main lead 300, i.e., portions that project outward beyond the outer edge of the main lead 300. As described later, the main lead 300 has portions exposed from the resin package 800. In this embodiment, the main lead 300 is formed by working a lead frame prepared in advance. That is, the main lead 300 is derived from the lead frame. For instance, the lead frame is formed by patterning a predetermined metal member (e.g. a plate made of Cu) by etching.

Figure 4:
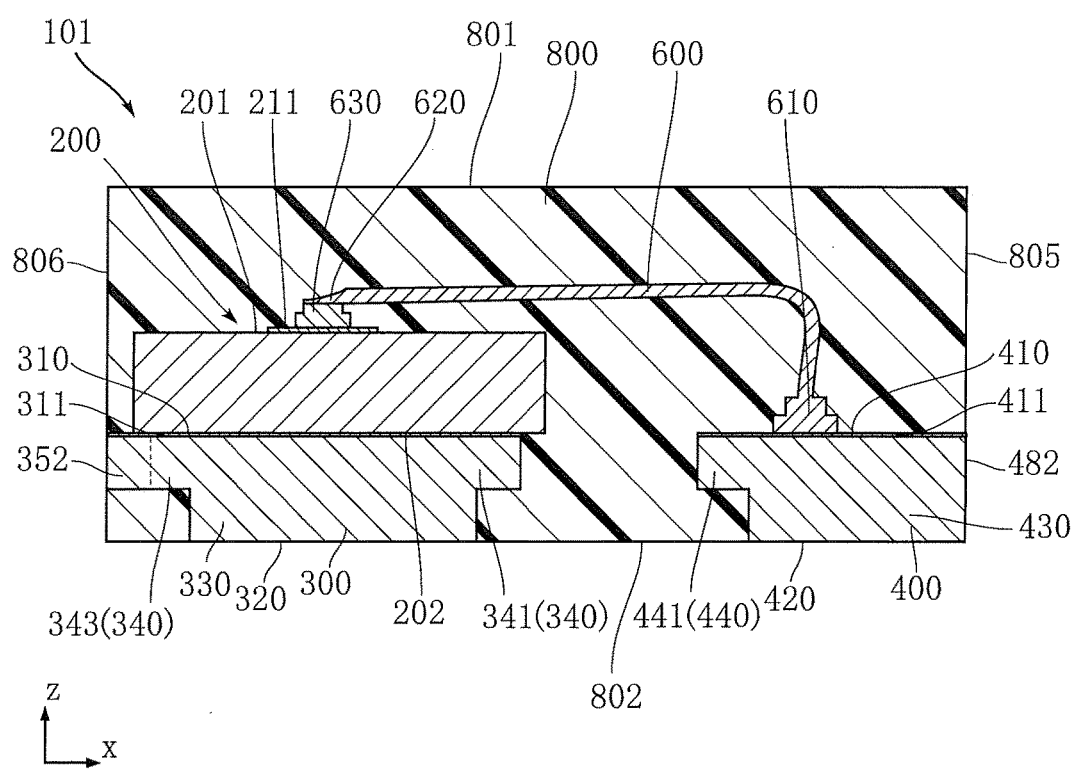
FIG. 4 is a sectional view taken along lines IV-IV in FIG. 2.
Figure 5:
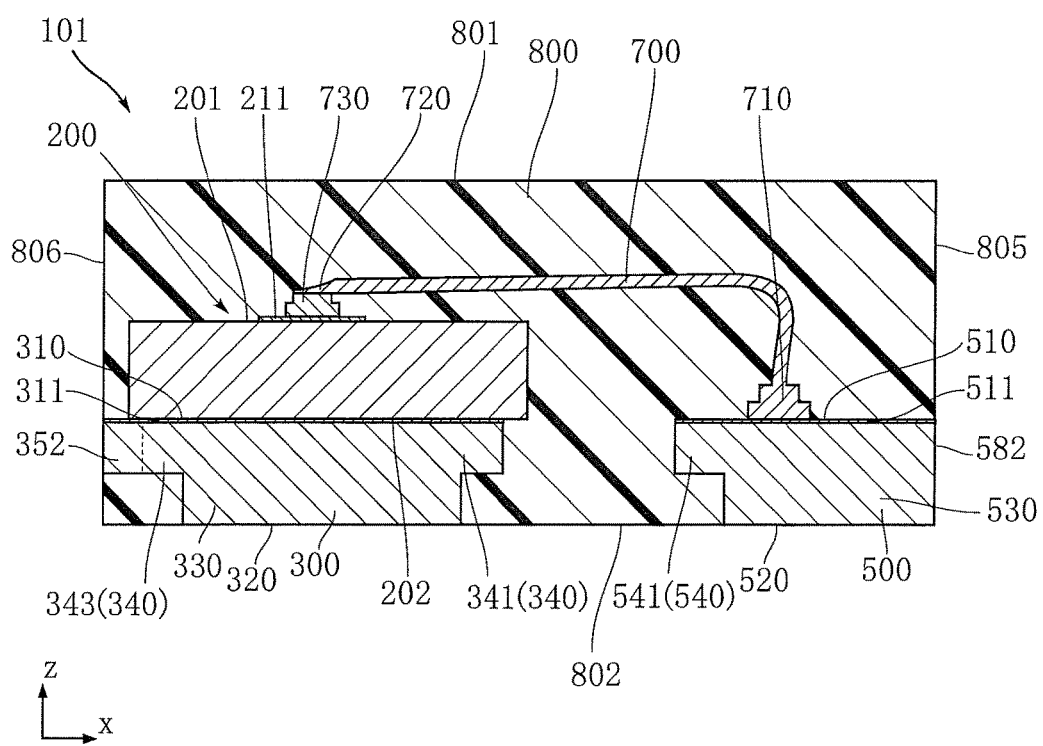
FIG. 5 is a sectional view taken along lines V-V in FIG. 2.

As illustrated in FIGS. 4 and 5, the main lead 300 has a main-lead obverse surface (die pad) 310 and a main-lead reverse surface (main-lead reverse surface terminal) 320 spaced apart from each other in the thickness direction z and facing in mutually opposite directions. Both of the main-lead obverse surface 310 and the main-lead reverse surface 320 are flat.

The main-lead obverse surface 310 faces upward in the thickness direction z. On the main-lead obverse surface 310 is placed the semiconductor element 200. The main-lead obverse surface 310 is formed with a main-lead obverse surface plating layer 311. The plating layer 311 is positioned between the semiconductor element 200 and the main lead 300. The plating layer 311 is formed over the entire region of the main-lead obverse surface 310. The plating layer 311 is about 2 μm in thickness and made of Ag.

In FIG. 3, the main-lead reverse surface 320 is indicated by hatching. The main-lead reverse surface 320 faces downward in the thickness direction z and is used for surface-mounting the semiconductor device 101 on a mount object (e.g. printed circuit board). The main-lead reverse surface 320 is rectangular. The area of the main-lead reverse surface 320 is smaller than that of the main-lead obverse surface 310 and the entirety of the main-lead reverse surface 320 overlaps the main-lead obverse surface 310 as viewed in the thickness direction z. That is, as viewed in the thickness direction z, the entirety of the main-lead reverse surface 320 is contained in the main-lead obverse surface 310.

The main lead 300 has a main-lead full-thickness portion 330 and a main-lead eaved portion 340.

The main-lead full-thickness portion 330 extends from the obverse surface 310 to the reverse surface 320 of the main lead in the thickness direction z. In this embodiment, the entirety of the full-thickness portion 330 overlaps the semiconductor element 200 as viewed in the thickness direction z. In the present invention, it is only necessary that at least one of the first obverse surface electrode 211 and the second obverse surface electrode 212 overlaps the full-thickness portion 330 as viewed in the thickness direction z. In the example illustrated in FIG. 2, as viewed in the thickness direction z, the first obverse surface electrode 211 and the second obverse surface electrode 212 are arranged adjacent to the center of the semiconductor element 200, and both of the first obverse surface electrode 211 and the second obverse surface electrode 212 overlap the full-thickness portion 330. Unlike this embodiment, only the first obverse surface electrode 211 (or only the second obverse surface electrode 212) may overlap the full-thickness portion 330 as viewed in the thickness direction z. For instance, the full-thickness portion 330 is about 0.9-1.1 mm in thickness. The full-thickness portion 330 provides the reverse surface 320 of the main lead.

The main-lead eaved portion 340 projects from the main-lead full-thickness portion 330 in a direction perpendicular to the thickness direction z. In this embodiment, the eaved portion 340 projects from the full-thickness portion 330 in the direction x and the direction y. In this embodiment, the eaved portion 340 projects in the direction x and the direction y from a portion of the full-thickness portion 330 adjacent to the main-lead obverse surface 310 (the portion adjacent to the obverse surface 310). For instance, the thickness of the eaved portion 340 is half the thickness of the full-thickness portion 330 and about 0.05 mm. The eaved portion 340 and the full-thickness portion 330 provide the main-lead obverse surface 310. The eaved portion 340 does not provide the main-lead reverse surface 320 and is spaced apart from the reverse surface 320 in the thickness direction z. As viewed in the thickness direction z, the eaved portion 340 surrounds the full-thickness portion 330. In this embodiment, the entirety of the eaved portion 340 overlaps the semiconductor element 200 as viewed in the thickness direction z.

The main-lead eaved portion 340 has a main-lead front portion 341, two main-lead side portions 342 and a main-lead rear portion 343. The main-lead front portion 341 projects from the main-lead full-thickness portion 330 toward the first sublead 400 and the second sublead 500.

Each of the main-lead side portions 342 projects from the full-thickness portion 330 in a direction (the direction y) perpendicular to the direction in which the main-lead front portion 341 projects. The main lead 300 further includes two main-lead side connecting portions 351. Each of the side connecting portions 351 extends from a corresponding one of the side portions 342 and has the same thickness as the side portion 342. The end surface of each side connecting portion 351 in the direction y (the end surface facing in the direction y) is exposed from the resin package 800.

The main-lead rear portion 343 projects from the full-thickness portion 330 in the direction opposite from the main-lead front portion 341. In this embodiment, the main lead 300 includes a main-lead rear connecting portion 352. The rear connecting portion 352 extends from the rear portion 343 of the main-lead eaved portion 340 and has the same thickness as the rear portion 343. The end surface of the rear connecting portion 352 in the direction x (the end surface facing in the direction x) is exposed from the resin package 800.

Figure 6:
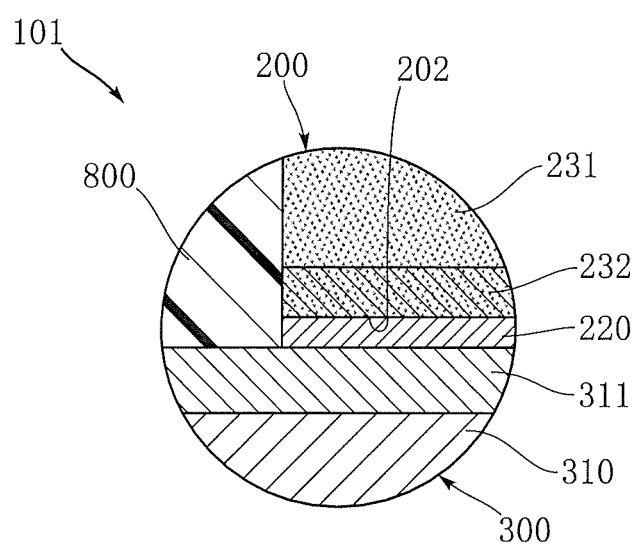
FIG. 6 is a sectional view illustrating a part of the semiconductor device of the first embodiment.
Figure 7:
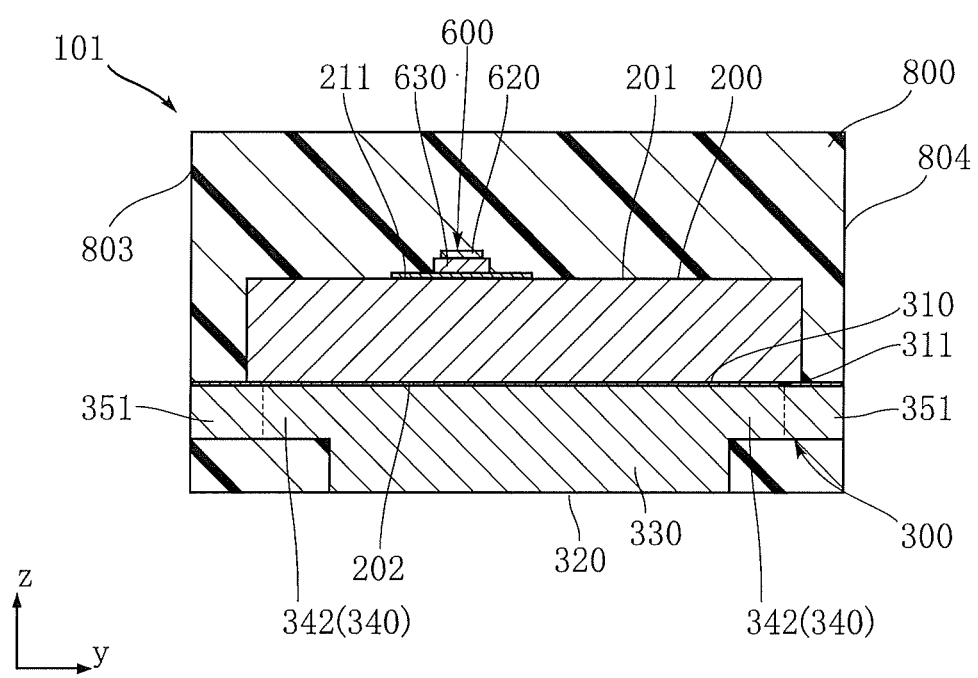
FIG. 7 is a sectional view taken along lines VII-VII in FIG. 2.
Figure 8:
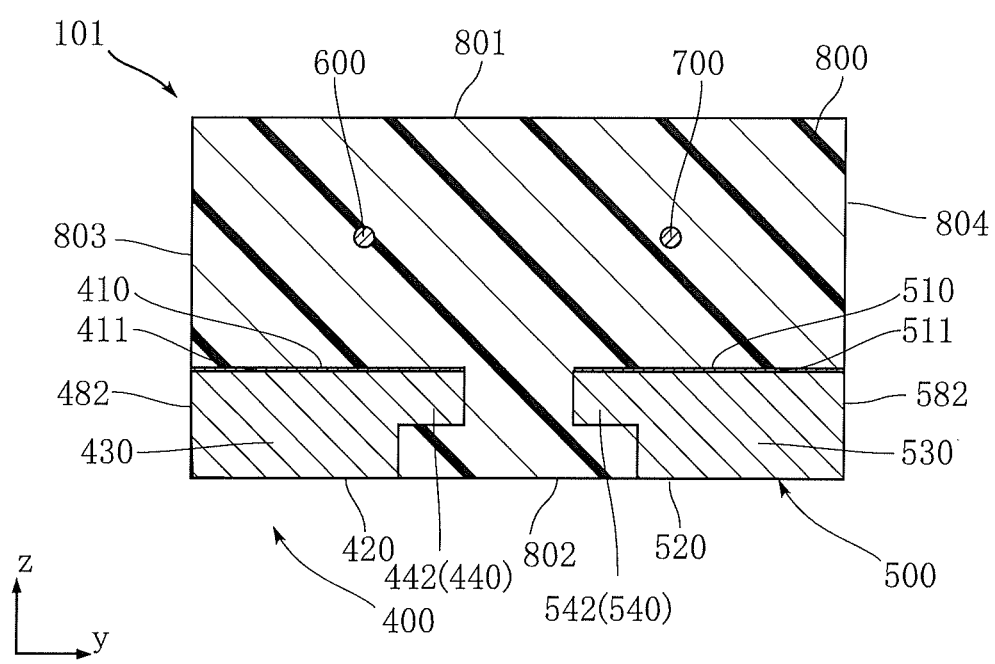
FIG. 8 is a sectional view taken along lines VIII-VIII in FIG. 2.
Figure 9:
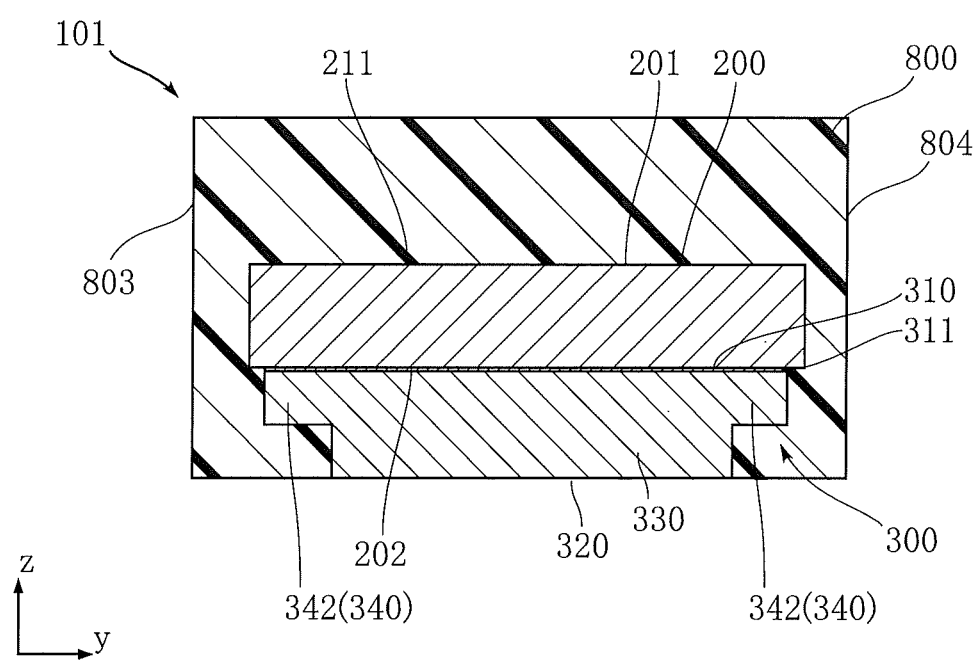
FIG. 9 is a sectional view taken along lines IX-IX in FIG. 2.

As illustrated in FIG. 6, the reverse surface electrode 220 of the semiconductor element 200 is bonded to the main-lead obverse surface 310 (main-lead obverse surface plating layer 311). Specifically, the reverse surface electrode 220 as a single metal layer is directly bonded to the plating layer 311 by e.g. thermocompression bonding. In the thermocompression bonding, only heat and pressure are applied and vibration is not applied.

The first sublead 400 is spaced apart from the main lead 300. Specifically, the first sublead 400 is spaced apart from the main lead 300 in the direction x. The first sublead 400 is spaced apart from the second sublead 500. As viewed in the thickness direction z, the first sublead 400 is exposed from the resin package 800 to the outside of the resin package 800. In this embodiment, the first sublead 400 is exposed from the resin package 800 in the direction x and the direction y. Similarly to the main lead 300, the first sublead 400 is derived from a lead frame.

The first sublead 400 includes a first sublead obverse surface (first wire bonding portion) 410, a first sublead reverse surface (first sublead reverse surface terminal) 420, a first sublead end surface 481 and a first sublead side surface 482. All of the obverse surface 410, the reverse surface 420, the end surface 481 and the side surface 482 of the first sublead are flat.

The first sublead obverse surface 410 faces upward in the thickness direction z. The first wire 600 is bonded to the obverse surface 410. The obverse surface 410 is formed with a first sublead obverse surface plating layer 411. The plating layer 411 is positioned between the obverse surface 410 and the first wire 600. The plating layer 411 is formed over the entire region of the obverse surface 410. For instance, the plating layer 411 is about 2 μm in thickness and made of Ag. In FIG. 1, the plating layer 411 is illustrated in halftone for easier understanding.

The first sublead reverse surface 420 faces in the opposite direction from the first sublead obverse surface 410. Specifically, the first sublead reverse surface 420 faces downward in the thickness direction z. The reverse surface 420 is exposed from the resin package 800. The reverse surface 420 is used for surface-mounting the semiconductor device 101. In FIG. 3, the reverse surface 420 is indicated by hatching.

The first sublead end surface 481 faces away from the main lead 300. Specifically, the end surface 481 faces to the right in FIG. 3. The end surface 481 is connected to the first sublead reverse surface 420. The end surface 481 is exposed from the resin package 800.

The first sublead side surface 482 faces in a direction perpendicular to both of the direction in which the first sublead end surface 481 faces and the thickness direction z of the semiconductor element 200. Specifically, the side surface 482 faces downward in FIG. 3. The side surface 482 is connected to the first sublead reverse surface 420. The side surface 482 is exposed from the resin package 800.

The first sublead 400 has a first sublead full-thickness portion 430 and a first sublead eaved portion 440. The full-thickness portion 430 extends from the obverse surface 410 to the reverse surface 420 of the first sublead in the thickness direction z. In this embodiment, the full-thickness portion 430 is about 0.1 mm in thickness. The full-thickness portion 430 provides the first sublead obverse surface 410 and the first sublead reverse surface 420. The full-thickness portion 430 is exposed from the resin package 800. Thus, the full-thickness portion 430 provides the end surface 481 and the side surface 482 of the first sublead.

The first sublead eaved portion 440 projects from the first sublead full-thickness portion 430 in a direction perpendicular to the thickness direction z. In this embodiment, the eaved portion 440 projects in the direction x and the direction y. For instance, the thickness of the eaved portion 440 is half the thickness of the full-thickness portion 430 and about 0.05 mm. The eaved portion 440 provides the obverse surface 410 of the first sublead. The eaved portion 440 does not provide the reverse surface 420 of the first sublead.

In this embodiment, the first sublead eaved portion 440 has a first sublead front portion 441 and a first sublead inner portion 442.

The first sublead front portion 441 projects from the full-thickness portion 430 toward the main lead 300. The inner portion 442 projects from the full-thickness portion 430 toward the second sublead 500.

The second sublead 500 is spaced apart from the main lead 300. Specifically, the second sublead 500 is spaced apart from the main lead 300 in the direction x. The second sublead 500 is spaced apart from the first sublead 400. As viewed in the thickness direction z, the second sublead 500 is exposed from the resin package 800 to the outside of the resin package. In this embodiment, the second sublead 500 is exposed from the resin package 800 in the direction x and the direction y. Similarly to the main lead 300 and the first sublead 400, the second sublead 500 is derived from a lead frame.

The second sublead 500 includes a second sublead obverse surface (second wire bonding portion) 510, a second sublead reverse surface (second sublead reverse surface terminal) 520, a second sublead end surface 581 and a second sublead side surface 582. All of the obverse surface 510, the reverse surface 520, the end surface 581 and the side surface 582 of the second sublead are flat.

The second sublead obverse surface 510 faces upward in the thickness direction z. The second wire 700 is bonded to the obverse surface 510. In this embodiment, the obverse surface 510 is formed with a first sublead obverse surface plating layer 511. The plating layer 511 is positioned between the obverse surface 510 and the second wire 700. The plating layer 511 is formed over the entire region of the obverse surface 510. For instance, the plating layer 511 is about 2 μm in thickness and made of Ag. In FIG. 1, the plating layer 511 is illustrated in halftone for easier understanding.

The second sublead reverse surface 520 faces in an opposite direction from the second sublead obverse surface 510. Specifically, the second sublead reverse surface 520 faces downward in the thickness direction z. The reverse surface 520 is exposed from the resin package 800. The reverse surface 520 is used for surface-mounting the semiconductor device 101. In FIG. 3, the reverse surface 520 is indicated by hatching.

The second sublead end surface 581 faces away from the main lead 300. Specifically, the end surface 581 faces to the right in FIG. 3. The end surface 581 is connected to the reverse surface 520 of the second sublead. The end surface 581 is exposed from the resin package 800.

The second sublead side surface 582 faces in a direction perpendicular to both of the direction in which the second sublead end surface 581 faces and the thickness direction z of the semiconductor element 200. Specifically, the side surface 582 faces upward in FIG. 3. The side surface 582 is connected to the reverse surface 520 of the first sublead. The side surface 582 is exposed from the resin package 800.

The second sublead 500 has a second sublead full-thickness portion 530 and a second sublead eaved portion 540. The full-thickness portion 530 extends from the obverse surface 510 to the reverse surface 520 of the second sublead in the thickness direction z. In this embodiment, the full-thickness portion 530 is about 0.1 mm in thickness. The full-thickness portion 530 provides the obverse surface 510 and the reverse surface 520 of the second sublead. The full-thickness portion 530 is exposed from the resin package 800. Thus, the full-thickness portion 530 provides the end surface 581 and the side surface 582 of the second sublead.

The second sublead eaved portion 540 projects from the second sublead full-thickness portion 530 in a direction perpendicular to the thickness direction z. In this embodiment, the eaved portion 540 projects in the direction x and the direction y. For instance, the thickness of the eaved portion 540 is half the thickness of the full-thickness portion 530 and about 0.05 mm. The eaved portion 540 provides the obverse surface 510 of the second sublead. The eaved portion 540 does not provide the reverse surface 520 of the second sublead.

In this embodiment, the second sublead eaved portion 540 has a second sublead front portion 541 and a second sublead inner portion 542.

The second sublead front portion 541 projects from the full-thickness portion 530 toward the main lead 300. The second sublead inner portion 542 projects from the full-thickness portion 530 toward the first sublead 400.

The first wire 600 is directly connected to the semiconductor element 200 and electrically connects the semiconductor element 200 and the first sublead 400 to each other. Specifically, the first wire 600 is bonded to the first obverse surface electrode 211 of the semiconductor element 200 and the obverse surface plating layer 411 of the first sublead.

The first wire 600 has a first bonding portion 610 and a second bonding portion 620. The first wire 600 is about 20 µm in diameter and made of Au.

The first bonding portion 610 is bonded to the obverse surface plating layer 411 of the first sublead and has a crown-like lump portion.

The second bonding portion 620 is bonded to the first obverse surface electrode 211 of the semiconductor element 200 via a first bump 630. The second bonding portion 620 has a tapered shape and the thickness in the direction z reduces as proceeding toward the end.

Figure 10:
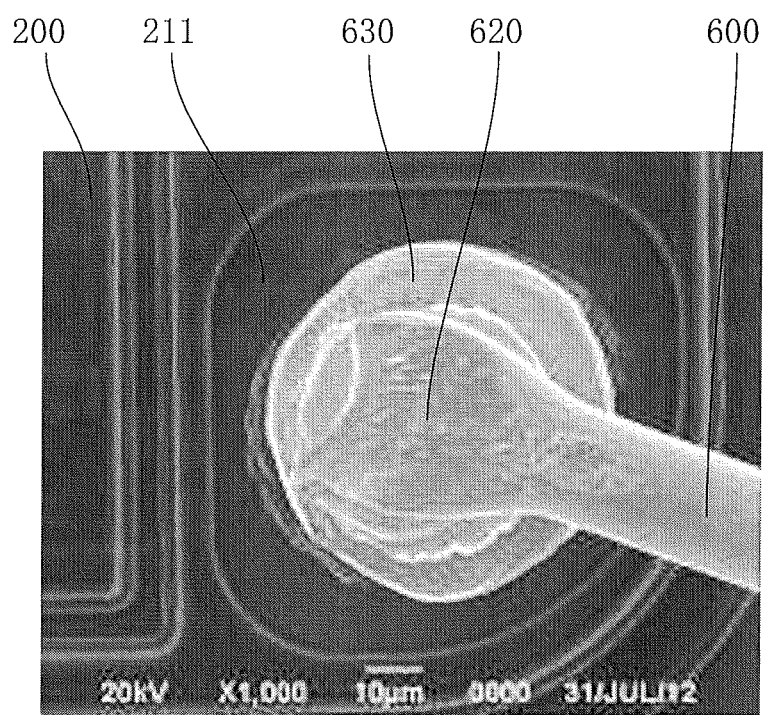
FIG. 10 shows an enlarged image of a second bonding portion of the semiconductor device of the first embodiment.

The first bump 630 is similar to the lump portion of the first bonding portion 610. In this embodiment, the volume of the first bump 630 is slightly smaller than that of the lump portion of the first bonding portion 610. As viewed in the thickness direction z, the first bump 630 overlaps the main-lead full-thickness portion 330. FIG. 10 shows an enlarged image of the second bonding portion 620 of the semiconductor device of FIG. 1.

The second wire 700 is directly connected to the semiconductor element 200 and electrically connects the semiconductor element 200 and the second sublead 500 to each other. Specifically, the second wire 700 is bonded to the second obverse surface electrode 212 of the semiconductor element 200 and the obverse surface plating layer 511 of the second sublead.

The second wire 700 has a first bonding portion 710 and a second bonding portion 720. The second wire 700 is about 20 µm in diameter and made of Au.

The first bonding portion 710 is bonded to the obverse surface plating layer 511 of the second sublead and has a crown-like lump portion.

The second bonding portion 720 is bonded to the second obverse surface electrode 212 of the semiconductor element 200 via a second bump 730. The second bonding portion 720 has a tapered shape and the thickness in the direction z reduces as proceeding toward the end.

The second bump 730 is similar to the lump portion of the first bonding portion 710. As viewed in the thickness direction z, the second bump 730 overlaps the main-lead full-thickness portion 330. In this embodiment, the volume of the second bump 730 is slightly smaller than that of the lump portion of the first bonding portion 710.

The resin package 800 covers the semiconductor element 200, the main lead 300, the first sublead 400, the second sublead 500, the first wire 600 and the second wire 700. For instance, the resin package 800 is made of black epoxy resin. The resin package 800 exposes the reverse surface 320 of the main lead 300, the reverse surface 420 of the first sublead 400 and the reverse surface 520 of the second sublead 500 to the lower side in the thickness direction z.

The resin package 800 has a resin obverse surface 801, a resin reverse surface 802, a first resin side surface 803, a second resin side surface 804, a first resin end surface 805 and a second resin end surface 806.

The resin obverse surface 801 faces in the same direction as the main-lead obverse surface 310. In this embodiment, the resin obverse surface 801 is flat.

The resin reverse surface 802 faces in the same direction as the main-lead reverse surface 320. That is, the resin reverse surface 802 faces in the opposite direction from the resin obverse surface 801. The resin reverse surface 802 is flat. The main lead 300, the first sublead 400 and the second sublead 500 are exposed from the resin reverse surface 802. The resin reverse surface 802 is flush with the main-lead reverse surface 320, the first sublead reverse surface 420 and the second sublead reverse surface 520.

The first resin side surface 803 faces in the same direction as the side surface 482 of the first sublead 400. The first resin side surface 803 is flat. The first sublead 400 is exposed from the first resin side surface 803. The first sublead full-thickness portion 430 is exposed from the first resin side surface 803. The first resin side surface 803 is flush with the first sublead side surface 482. The main lead 300 is exposed from the first resin side surface 803. Specifically, the side connecting portions 351 of the main lead 300 is exposed from the first resin side surface 803. The first resin side surface 803 is flush with the end surface of the main-lead side connecting portion 351.

The second resin side surface 804 faces in the same direction as the side surface 582 of the second sublead 500. The second resin side surface 804 is flat. The second sublead 500 is exposed from the second resin side surface 804. The second resin side surface 804 is flush with the second sublead side surface 582. In this embodiment, the second sublead full-thickness portion 530 is exposed from second resin side surface 804. Moreover, the main lead 300 is exposed from the second resin side surface 804. Specifically, the side connecting portions 351 of the main lead 300 is exposed from the second resin side surface 804. The second resin side surface 804 is flush with the end surface of the main-lead side connecting portion 351.

The first resin end surface 805 faces in the same direction as the end surface 481 of the first sublead 400. The first resin end surface 805 is flat. The first sublead 400 is exposed from the first resin end surface 805. The first resin end surface 805 is flush with the first sublead end surface 481. In this embodiment, the first sublead full-thickness portion 430 is exposed from the first resin end surface 805. Similarly, the first resin end surface 805 faces in the same direction as the end surface 581 of the second sublead 500. The second sublead 500 is exposed from the first resin end surface 805. The first resin end surface 805 is flush with the second sublead end surface 581. The second sublead full-thickness portion 530 is exposed from the first resin end surface 805.

The second resin end surface 806 faces in the opposite direction from the first resin end surface 805. The second resin end surface 806 is flat. The main lead 300 is exposed from the second resin end surface 806. In this embodiment, the main-lead rear connecting portion 352 is exposed from the second resin end surface 806. The second resin end surface 806 is flush with the end surface of the main-lead rear connecting portion 352.

Figure 11:
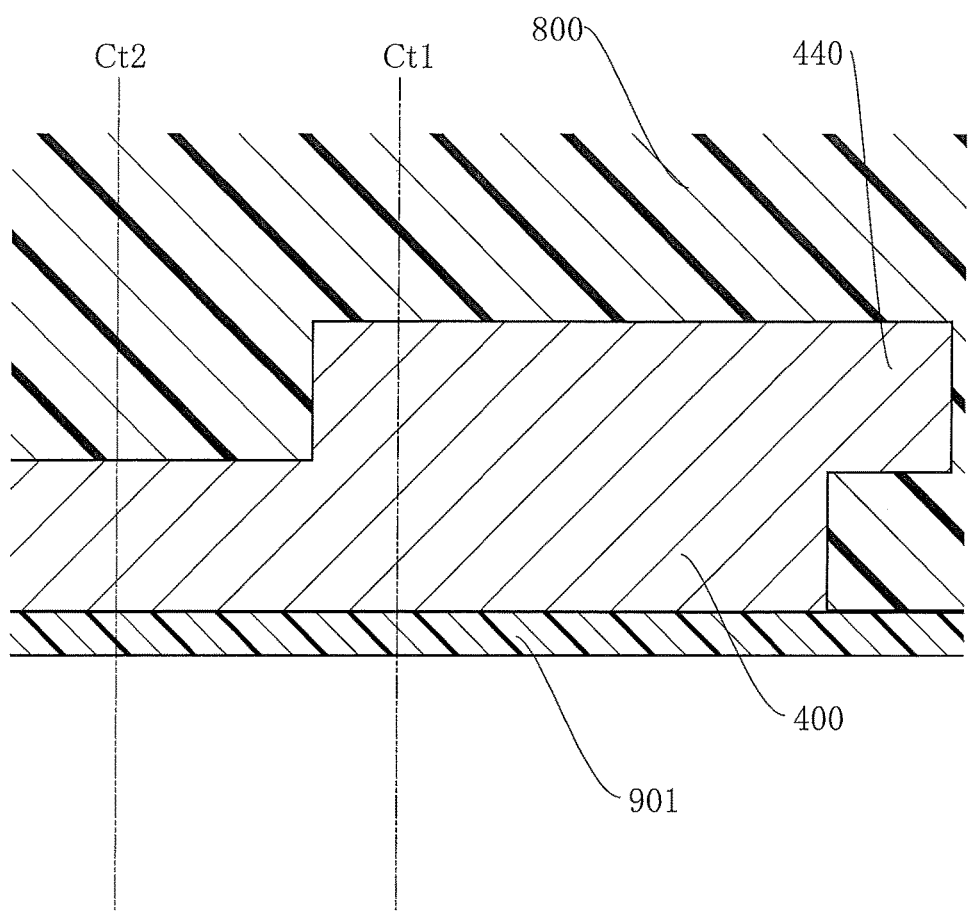
FIG. 11 is a sectional view illustrating a step of a method for making the semiconductor device of the first embodiment.

In the process of making the semiconductor device 101, a resin member to become the resin package and a lead frame are diced collectively. This is the reason why the above-described surfaces of the resin package and the above-described surfaces of the leads (main lead 300, first sublead 400 or the second sublead 500) are flush with each other. FIG. 11 is a sectional view illustrating a step of a method for making the semiconductor device of FIG. 1 and shows the portion adjacent to the first sublead 400. The lead and the resin member are cut along the cutting line Ct1 in this figure.

The advantages of the foregoing embodiment are described below.

The semiconductor element 200 includes portions that do not overlap the main lead 300 as viewed in the thickness direction z. With this arrangement, the size of the main lead 300 is smaller than that of the semiconductor element 200 as viewed in the thickness direction z. Thus, the size of the resin package 800 as viewed in the thickness direction z depends not on the size of the main lead 300 but on the size of the semiconductor element 200. Thus, the size of the semiconductor device 101 as viewed in the thickness direction z can be reduced.

The main lead 300 includes a full-thickness portion 330 and an eaved portion 340. This arrangement provides a large bonding area between the semiconductor element 200 and the main lead 300. Thus, the semiconductor element 200 is reliably bonded to the main lead 300.

The second bonding portion 620 of the first wire 600 is bonded to the first obverse surface electrode 211 via the first bump 630, whereas the second bonding portion 720 of the second wire 700 is bonded to the second obverse surface electrode 212 via the second bump 730. This arrangement reduces the heights of the first wire 600 and the second wire 700. This allows the dimension of the semiconductor device 101 in the thickness direction z to be reduced. Thus, this embodiment achieves size reduction of the semiconductor device 101.

The first obverse surface electrode (gate electrode) 211 is positioned further away from the first sublead 400 and the second sublead 500 than the second obverse surface electrode (source electrode) 212 is. Thus, the first wire 600 can be made longer than the second wire 700. The longer first wire 600 can be easily bonded to the second bonding portion 620 with higher bonding strength. The first obverse surface electrode 211 as the gate electrode is formed on a relatively smooth surface of the semiconductor layer 231 via an insulating layer. Thus, it is relatively difficult to bond a wire onto the first obverse surface electrode 211 with a high bonding strength. On the other hand, the second obverse surface electrode 212 as the source electrode is connected to a metal portion filling a plurality of trenches (vertical holes) formed in the semiconductor layer 231. Owing to this arrangement, it is relatively easy to bond a wire onto the second obverse surface electrode 212 with a high bonding strength. Thus, bonding the first wire 600, which can be bonded with higher bonding strength, to the first obverse surface electrode 211, which is likely to lack the wire bonding strength, is advantageous for preventing wire separation. Since the main-lead eaved portion 340 has the front portion 341, the bonding strength between the main lead 300 and the resin package 800 is enhanced. Moreover, while the distance between the semiconductor element 200 and the first sublead 400 or the second sublead 500 is reduced, the main-lead reverse surface 320 is prevented from being positioned too close to the first sublead reverse surface 420 and the second sublead reverse surface 520.

Since the main-lead eaved portion 340 has side portions 342 and the rear portion 343, the bonding strength between the main lead 300 and the resin package 800 is enhanced. The arrangement in which the entirety of the main-lead full-thickness portion 330 is surrounded by the main-lead eaved portion 340 is advantageous for enhancing the bonding strength between the main lead 300 and the resin package 800.

The main-lead side connecting portions 351 and the main-lead rear connecting portion 352 hold the main lead 300 properly during the process for making the semiconductor device 101. The end surface of the main-lead side connecting portion 351 in the direction y and the end surface of the main-lead rear connecting portion 352 in the direction x are spaced apart from the main-lead reverse surface 320, though exposed from the resin package 800. Thus, solder for surface-mounting the semiconductor device 101 does not spread onto the end surface of the main-lead side connecting portion 351 in the direction y and the end surface of the main-lead rear connecting portion 352 in the direction x.

Since the main-lead obverse surface plating layer 311 is formed on the main-lead obverse surface 310, the bonding strength between the reverse surface electrode 220 of the semiconductor element 200 and the main-lead obverse surface 310 is enhanced. Since the main-lead obverse surface plating layer 311 overlaps the entirety of the main-lead eaved portion 340, a large area can be used as the main-lead obverse surface 310.

Since the first sublead 400 has a first sublead eaved portion 440, the bonding strength between the first sublead 400 and the resin package 800 is enhanced. Since the first sublead eaved portion 440 has the front portion 441, the first sublead reverse surface 420 is prevented from being positioned too close to the main-lead reverse surface 320, while enhanced bonding strength with the resin package 800 is provided. Thus, even when the semiconductor device 101 is made small, the first sublead reverse surface 420 and the main-lead reverse surface 320 are prevented from being electrically connected to each other by way of the solder adhering to the first sublead reverse surface 420 and the solder adhering to the main-lead reverse surface 320.

Since the first sublead eaved portion 440 has the first sublead inner portion 442, the bonding strength between the first sublead 400 and the resin package 800 is enhanced. Moreover, since the first sublead eaved portion 440 has the first sublead inner portion 442, the first sublead reverse surface 420 and the second sublead reverse surface 520 are prevented from being positioned too close to each other, while enhanced bonding strength with the resin package 800 is provided. Thus, even when the semiconductor device 101 is made small, the first sublead reverse surface 420 and the second sublead reverse surface 520 are prevented from being electrically connected to each other by way of the solder adhering to the first sublead reverse surface 420 and the solder adhering to the second sublead reverse surface 520.

The first sublead 400 has the end surface 481 connected to the reverse surface 420. The first sublead end surface 481 is exposed from the resin package 800. Thus, the first sublead reverse surface 420 can be made larger. Thus, the tape 901 (see FIG. 11) used in a resin-molding process for forming the resin package 800 and the first sublead reverse surface 420 can be bonded strongly. Thus, during the resin molding, the resin material is prevented from entering between the tape 901 and the first sublead reverse surface 420. Thus, formation of resin burrs on the first sublead reverse surface 420 is prevented. The arrangement that the first sublead side surface 482 is exposed from the resin package 800 provides the same advantages. Moreover, the same advantages as those related to the first sublead 400 are provided by the arrangement that the second sublead end surface 581 and the second sublead side surface 582 are exposed from the resin package 800.

Since the first sublead obverse surface plating layer 411 is formed on the first sublead obverse surface 310, the bonding strength between the first wire 600 and the first sublead obverse surface 410 is enhanced.

Since the second sublead 500 has a second sublead eaved portion 540, the bonding strength between the second sublead 500 and the resin package 800 is enhanced. Since the second sublead eaved portion 540 has the front portion 541, the second sublead reverse surface 520 is prevented from being positioned too close to the main-lead reverse surface 320, while enhanced bonding strength with the resin package 800 is provided.

Since the second sublead eaved portion 540 has the second sublead inner portion 542, the bonding strength between the second sublead 500 and the resin package 800 is enhanced. Moreover, since the second sublead eaved portion 540 has the second sublead inner portion 542, the second sublead reverse surface 520 and the first sublead reverse surface 420 are prevented from being positioned too close to each other, while enhanced bonding strength with the resin package 800 is provided. Thus, even when the semiconductor device 101 is made small, the first sublead reverse surface 420 and the second sublead reverse surface 520 are prevented from being electrically connected to each other by way of the solder adhering to the first sublead reverse surface 420 and the solder adhering to the second sublead reverse surface 520.

Since the second sublead obverse surface plating layer 511 is formed on the second sublead obverse surface 510, the bonding strength between the second wire 700 and the second sublead obverse surface 510 is enhanced.

The semiconductor element 200 is bonded to the obverse surface 310 of the main lead 300 by directly bonding the reverse surface electrode 220 made of a single metal layer to the main-lead obverse surface plating layer 311, and vibration is not applied in the bonding process. Thus, it is not necessary to provide the main lead 300 with an extra region around the semiconductor element 200 in consideration for the application of vibration. This is advantageous for size reduction of the semiconductor device 101.

Figure 12:
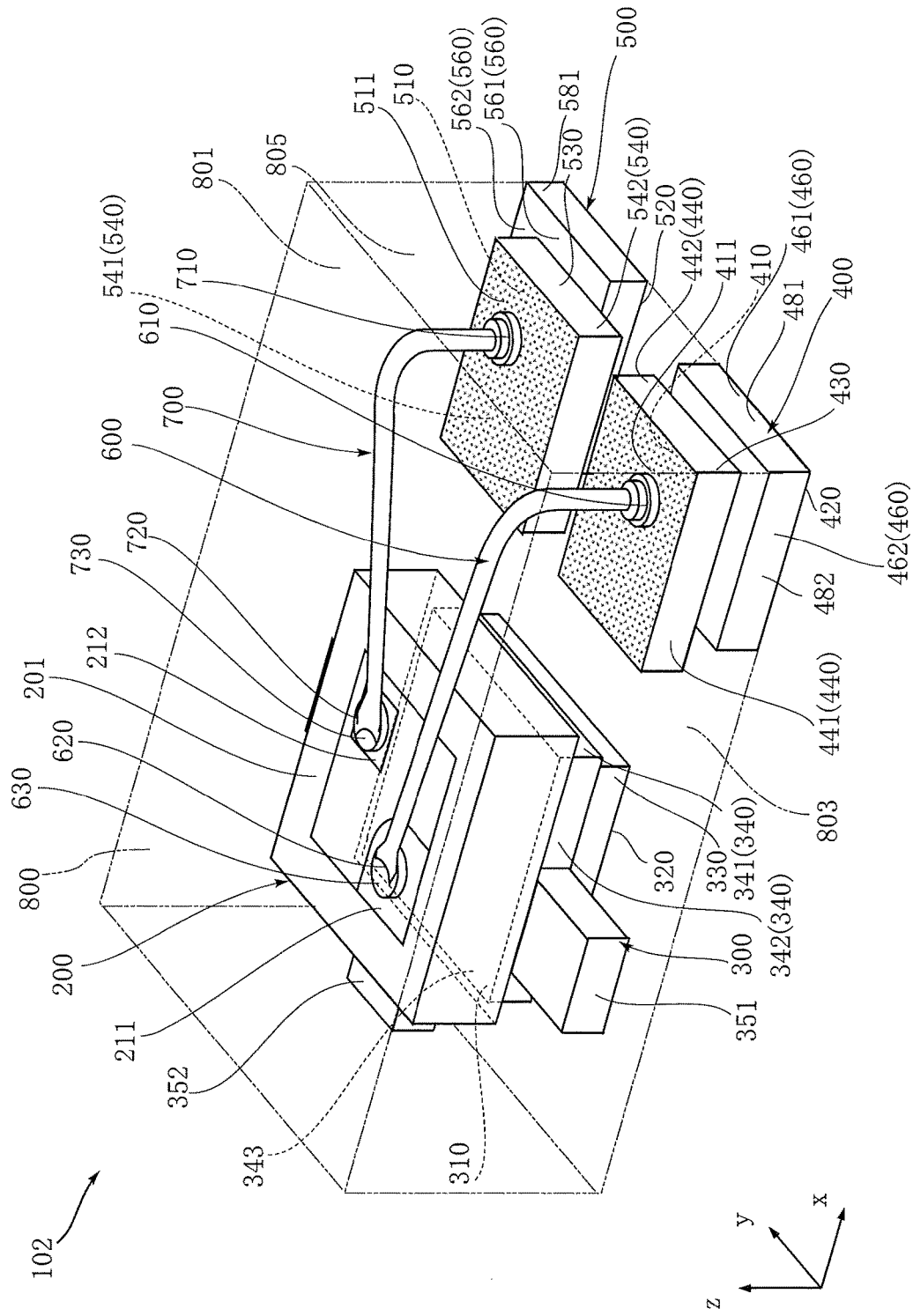
FIG. 12 is a perspective view illustrating a semiconductor device according to a second embodiment of the present invention.
Figure 13:
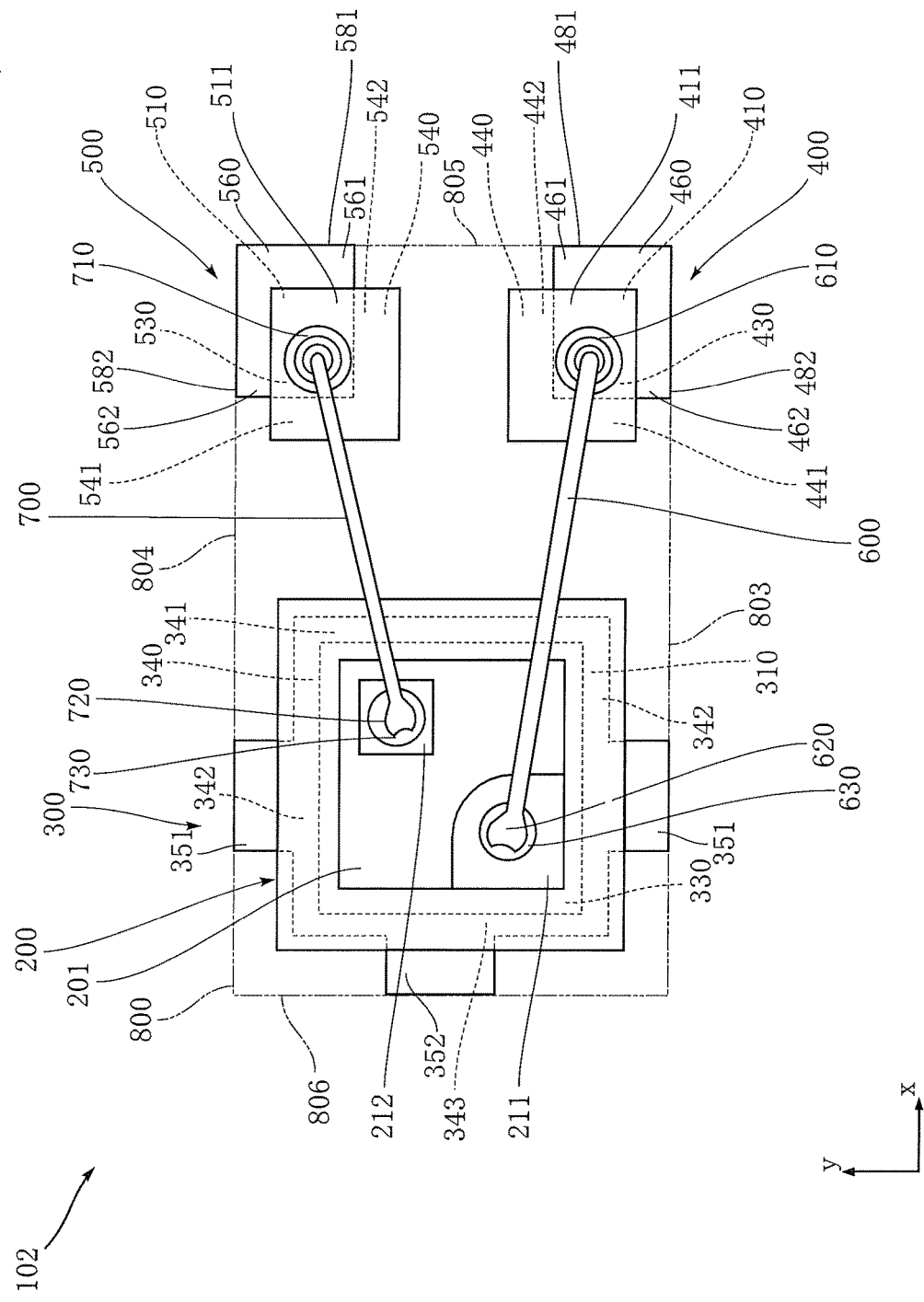
FIG. 13 is a plan view illustrating the semiconductor device of the second embodiment.

A semiconductor device according to a second embodiment of the present invention is described below with reference to FIGS. 12 and 13. The semiconductor device 102 illustrated in these figures differ from the semiconductor device 101 of the first embodiment in shapes of the first sublead 400 and the second sublead 500. Other elements that are the identical or similar to those of the semiconductor device 101 are designated by the same reference signs as those used for the first embodiment and explanation is omitted.

In the second embodiment, the first sublead 400 has an extension 460 in addition to the full-thickness portion 430 and the eaved portion 440. In this embodiment, the full-thickness portion (the first sublead full-thickness portion 430) is not exposed from the side surface of the resin package 800.

The first sublead extension 460 extends out from the first sublead full-thickness portion 430 in a direction perpendicular to the thickness direction z. For instance, the thickness of the extension 460 is half the thickness of the full-thickness portion 430 and about 0.05 mm. The extension 460 provides a part of the first sublead reverse surface 420. (Remaining portions of the first sublead reverse surface 420 are provided by the full-thickness portion 430.) The extension 460 does not provide the first sublead obverse surface 410. As viewed in the thickness direction z, the extension 460 is exposed from the side surfaces of the resin package 800 to the outside of the resin package 800. Specifically, the extension 460 is exposed from the resin package 800 in the direction x and the direction y. Thus, the extension 460 provides the first sublead end surface 481 and the first sublead side surface 482.

In this embodiment, the first sublead extension 460 includes a first sublead rear portion 461 and a first sublead side portion 462. The rear portion 461 projects from the first sublead full-thickness portion 430 in a direction away from the main lead 300. The rear portion 461 provides the first sublead end surface 481. The side portion 462 projects from the full-thickness portion 430 in a direction away from the second sublead 500. The side portion 462 provides the first sublead side surface 482.

The second sublead 500 has a full-thickness portion 530, an eaved portion 540 and an extension 560. In this embodiment, the full-thickness portion (the second sublead full-thickness portion 530) is not exposed from the side surface of the resin package 800.

The second sublead extension 660 extends out from the second sublead full-thickness portion 530 in a direction perpendicular to the thickness direction z. For instance, the thickness of the extension 560 is half the thickness of the full-thickness portion 530 and about 0.05 mm. The extension 560 provides a part of the second sublead reverse surface 520. (Remaining portions of the second sublead reverse surface 520 are provided by the full-thickness portion 530.) The extension 560 does not provide the second sublead obverse surface 510. As viewed in the thickness direction z, the extension 560 is exposed from the side surfaces of the resin package 800 to the outside of the resin package 800. Specifically, the extension 560 is exposed from the resin package 800 in the direction x and the direction y. Thus, the extension 560 provides the second sublead end surface 581 and the second sublead side surface 582.

In this embodiment, the second sublead extension 560 includes a second sublead rear portion 561 and a second sublead side portion 562. The rear portion 561 projects from the full-thickness portion 530 in a direction away from the main lead 300. The rear portion 561 provides the second sublead end surface 581. The side portion 562 projects from the full-thickness portion 530 in a direction away from the first sublead 400. The side portion 562 provides the second sublead side surface 582.

In the process of making the semiconductor device 102, the lead and the resin member are cut along the cutting lines Ct2 in FIG. 11, which is used for explaining the semiconductor device 101.

The advantages of the second embodiment are described below. This embodiment provides the following advantages in addition to the advantages provided by the semiconductor device 101.

According to the second embodiment, in cutting the lead frame to provide the first sublead 400, a relatively thin portion is diced, and it is not necessary to dice a relatively thick portion (the portion corresponding to the first sublead full-thickness portion 430). The amount of burrs to be formed is proportional to the thickness of the lead frame that is cut. Thus, by cutting a relatively thin portion of the lead frame, formation of burrs is suppressed. Similarly, in the process of forming the second sublead 500, a relatively thin portion of the lead frame is cut, so that formation of metal burrs is suppressed.

In the first and the second embodiments, when the main lead 300 and the first and the second subleads 400, 500 are pattern-formed by etching, a clear corner like those illustrated in FIGS. 1-13 is not formed at each boundary between adjacent portions of each lead, and each boundary can be a curved surface. Specifically, the boundary between the full-thickness portion 330 and the eaved portion 340 of the main lead 300, the boundary between the full-thickness portion 430 and the eaved portion 440 or the boundary between the eaved portion 440 and the extension 460 of the first sublead 400 can be a curved surface. The boundary between the full-thickness portion 530 and the eaved portion 540 or the boundary between the eaved portion 540 and the extension 560 of the second sublead 500 can be a curved surface. In making a very small semiconductor device, such a curved surface tends to be formed inevitably during the etching process, against the intention of design.

Figure 15:
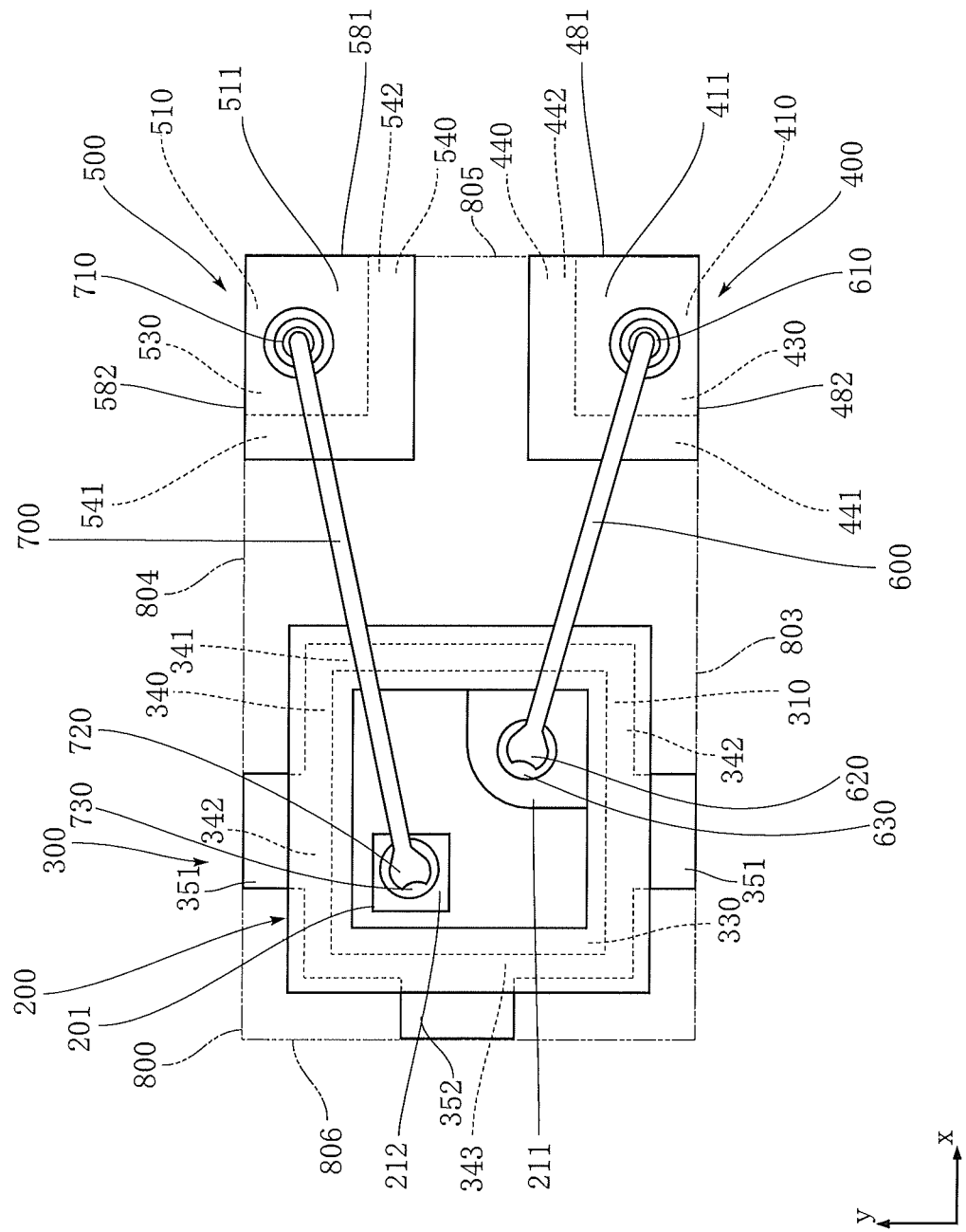
FIG. 15 is a plan view illustrating a variation of the semiconductor device of the first embodiment.

FIG. 15 illustrates a variation of the semiconductor device 101 of the first embodiment (see FIG. 2). As illustrated in the figure, the positions of the first obverse surface electrode 211, second obverse surface electrode 212, second bonding portions 620, 720, first bump 630 and second bump 730 differ from those of the semiconductor device 101. In other points, the semiconductor device illustrated in FIG. 15 is the same as the semiconductor device 101 of the first embodiment.

Specifically, in FIG. 2, the first obverse surface electrode 211 is offset to the left on the semiconductor element 200, whereas the second obverse surface electrode 212 is offset to the right on the semiconductor element 200. In FIG. 2, the second bonding portion 620 and the first bump 630 are offset to the left from the second bonding portion 720 and the second bump 730. On the other hand, in FIG. 15, the first obverse surface electrode 211 is offset to the right on the semiconductor element 200, whereas the second obverse surface electrode 212 is offset to the left on the semiconductor element 200. In FIG. 15, the second bonding portion 620 and the first bump 630 are offset to the right from the second bonding portion 720 and the second bump 730. In this way, in the present invention, the positions of the first obverse surface electrode 211 and the second obverse surface electrode 212 can be changed.

FIGS. 16-24 illustrate a semiconductor device 103 according to a third embodiment of the present invention.

The semiconductor device 103 of this embodiment includes a semiconductor element 200, a main lead 300, a first sublead 400, a second sublead 500, a first wire 600, a second wire 700 and a resin package 800. The semiconductor device 103 is configured as a relatively small device that can be surface-mounted and is e.g. about 0.8 mm in dimension in the direction x, about 0.6 mm in dimension in the direction y and about 0.36 mm in dimension in the direction z (thickness direction).

The semiconductor element 200 is configured as a transistor. Similarly to the foregoing embodiment, the semiconductor element 200 may be other kinds of semiconductor elements (e.g. diode). The semiconductor element 200 includes an element body having an obverse surface 201 and a reverse surface 202 and is formed with a first obverse surface electrode 211, a second obverse surface electrode 212 and a reverse surface electrode 220. The obverse surface 201 and the reverse surface 202 are spaced apart from each other in the direction z and face in mutually opposite directions. For instance, the semiconductor element 200 is about 300 μm in dimension in the direction x and about 300 μm in dimension in the direction y.

Figure 18:
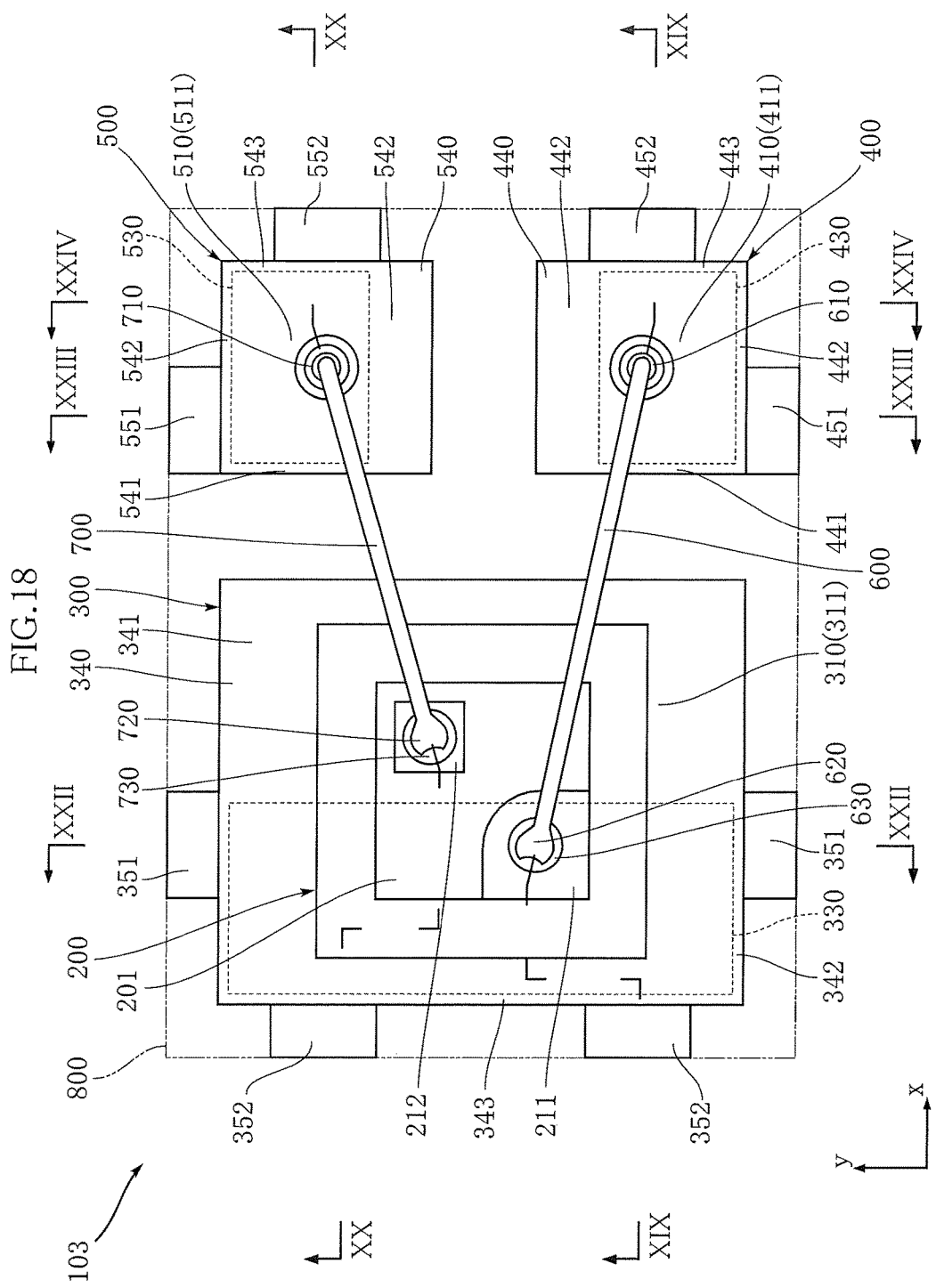
FIG. 18 is a plan view illustrating the semiconductor device according to the third embodiment of the present invention.
Figure 25:
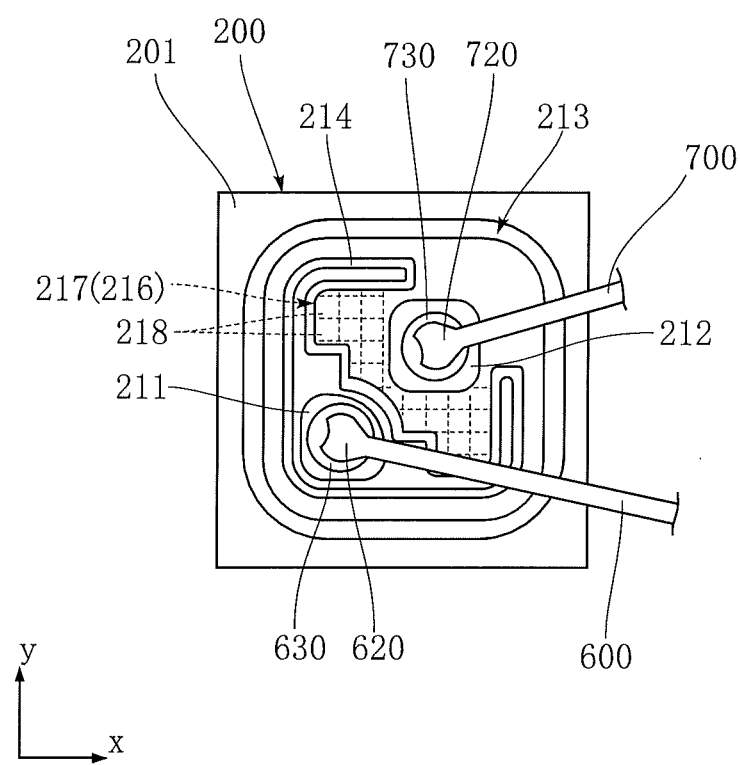
FIG. 25 is a plan view illustrating a part of a semiconductor element of the third embodiment.

As illustrated in FIG. 25, the first obverse surface electrode 211 and the second obverse surface electrode 212 are formed on the obverse surface 201 as a part of an electrode layer 213. For instance, the electrode layer 213 comprises an Au-plated layer. The first obverse surface electrode 211 is a gate electrode, whereas the second obverse surface electrode 212 is a source electrode. As illustrated in FIG. 25 or 18, in the direction x, the first obverse surface electrode 211 is positioned on the left of the second obverse surface electrode 212. (Or, the second obverse surface electrode 212 is positioned on the right of the first obverse surface electrode 211.) In the direction y, the first obverse surface electrode 211 is positioned on the lower side of the second obverse surface electrode 212. (Or, the second obverse surface electrode 212 is positioned on the upper side of the first obverse surface electrode 211.) The reverse surface electrode 220 is formed on the reverse surface 202. The reverse surface electrode 220 is a drain electrode.

A removal region 214 is formed by removing a part of the electrode layer 213. The removal region 214 surrounds the first obverse surface electrode 211. Specifically, as illustrated in FIG. 25, the removal region 214 includes two portions extending parallel to the upper edge of the semiconductor element 200 (and a connecting portion that connects the right ends of these portions to each other), two portions extending parallel to the right edge of the semiconductor element 200 (and a connecting portion that connects the upper ends of these portions to each other), and two portions sandwiching the first obverse surface electrode 211 in the neighborhood of the electrode. With these portions connected to each other, the removal region 214 completely surrounds the first obverse surface electrode 211. The removal region 214 in the form of an enclosure provides insulation between the first obverse surface electrode 211 and the second obverse surface electrode 212.

An active region 216 is provided adjacent to the second obverse surface electrode 212. A MOSFET 217 is built in the active region 216. Specifically, the MOSFET 217 is formed inside the element body (i.e., in the inner portion spaced apart from the obverse surface 201 in the direction z) and is made up of a plurality of unit cells 218. In the example illustrated in FIG. 25, the unit cells 218 are arranged in a matrix (i.e., the unit cells are aligned in the vertical direction and the horizontal direction). However, the present invention is not limited to this, and the unit cells may be arranged in other manners. For instance, the unit cells may be arranged in rows or columns or in a staggered manner.

Although only the second obverse surface electrode 212 is provided as the source electrode in this embodiment, the present invention is not limited to this. For instance, a plurality of source electrodes may be provided.

Figure 21:
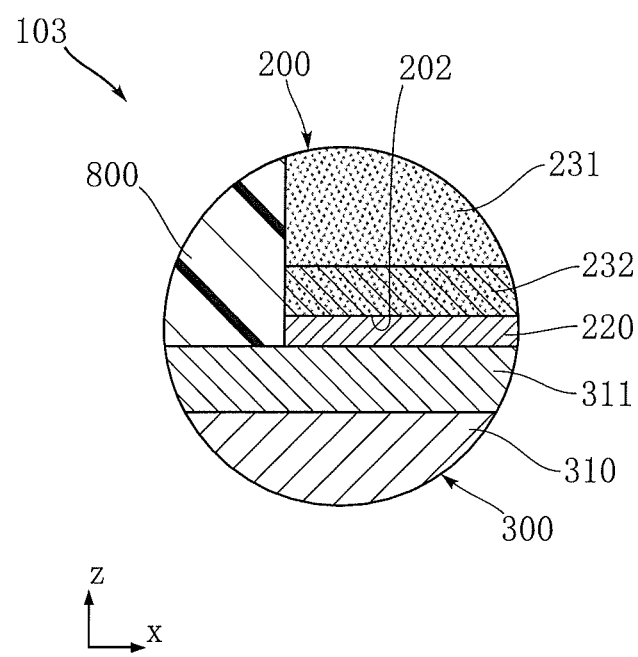
FIG. 21 is a sectional view illustrating a part of the semiconductor device of the third embodiment.
Figure 22:
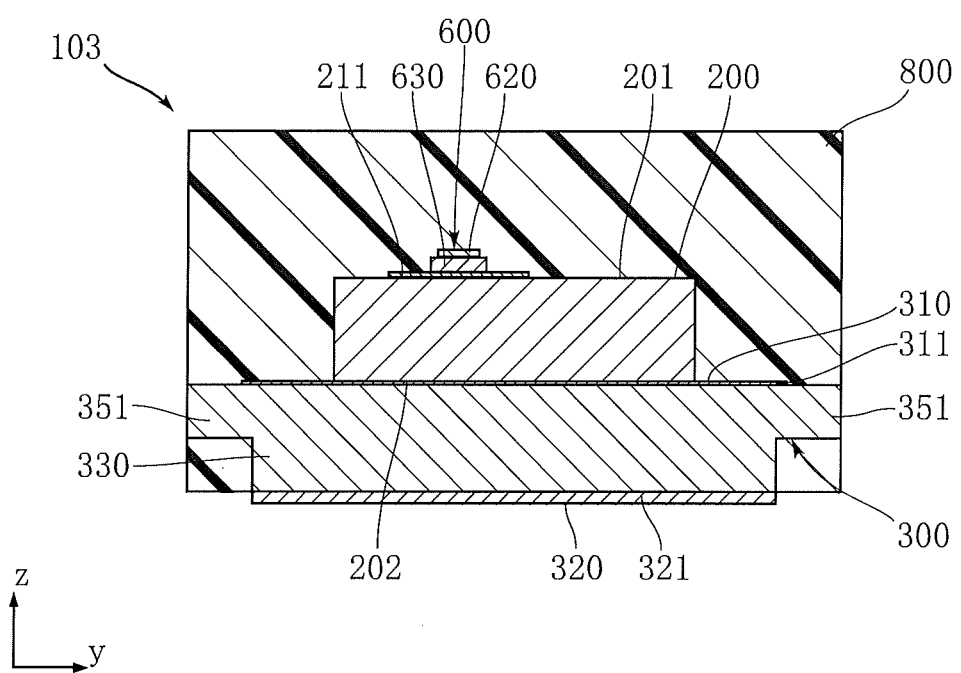
FIG. 22 is a sectional view taken along lines XXII-XXII in FIG. 18.
Figure 23:
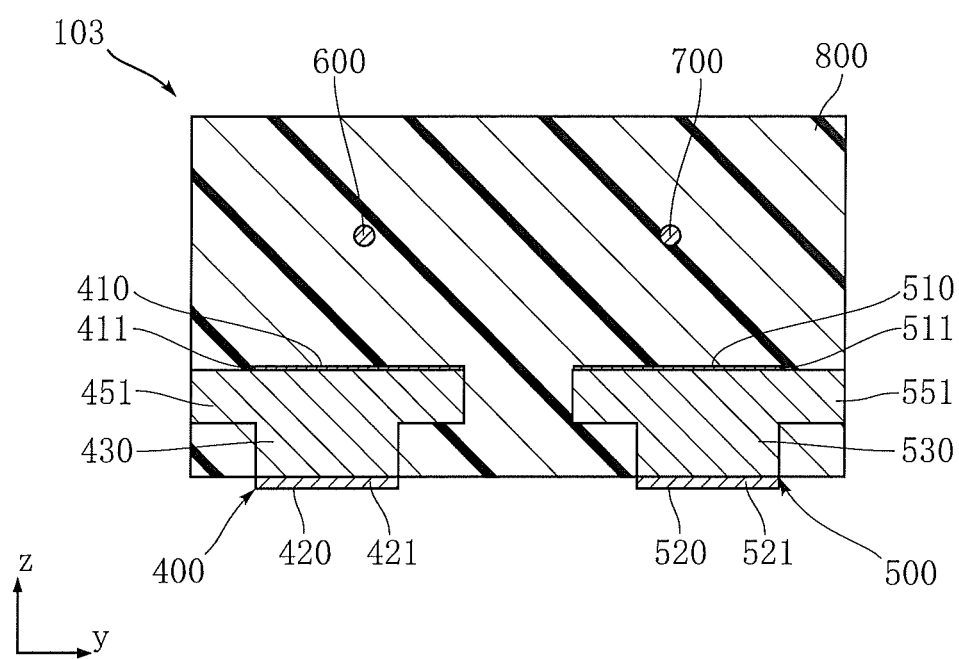
FIG. 23 is a sectional view taken along lines XXIII-XXIII in FIG. 18.
Figure 24:
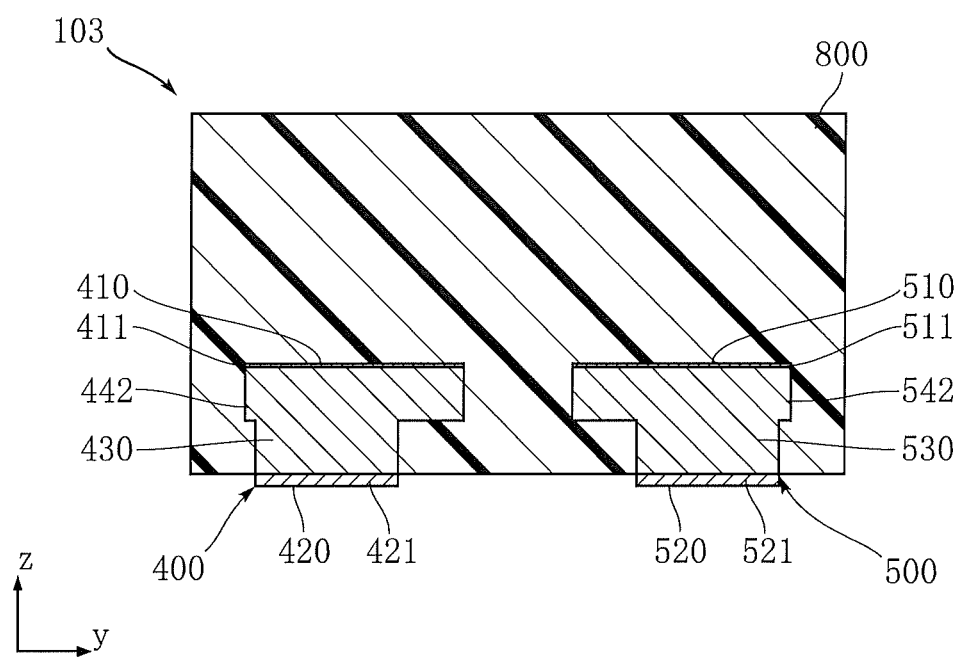
FIG. 24 is a sectional view taken along lines XXIV-XXIV in FIG. 18.

FIG. 21 illustrates the reverse surface electrode 220 and the nearby portions of the semiconductor element 200. The semiconductor element 200 of this embodiment has a semiconductor layer 231 and a eutectic layer 232. The semiconductor layer 231 incorporates parts to function as a transistor and is made of e.g. Si. The eutectic layer 232 is made of a eutectic of a semiconductor forming the semiconductor layer 231 and a metal. In this embodiment, the eutectic layer 232 is made of a eutectic of Si and Au. The eutectic layer 232 is formed by an alloying process comprising laminating an Au layer on the semiconductor layer 231 followed by heating these layers. A reverse surface electrode 220 is formed under the eutectic layer 232 in the direction z. The reverse surface electrode 220 is provided by forming an Au layer (single metal layer) on the eutectic layer 232 by vapor deposition. For instance, the thickness of the eutectic layer 232 is about 1200 nm. The reverse surface electrode 220 is about 600 nm in thickness and thinner than the eutectic layer 232. In this embodiment, the reverse surface of the element body refers to the surface 202 of the eutectic layer 232 which faces downward in the direction z.

The main lead 300 has a die pad 310, a main-lead reverse surface terminal 320, a main-lead full-thickness portion 330 and a main-lead eaved portion 340. The main lead 300 is formed by working a lead frame prepared in advance. That is, the main lead 300 is derived from the lead frame. The lead frame is formed by patterning a predetermined metal member (e.g. plate made of Cu) by etching.

Figure 16:
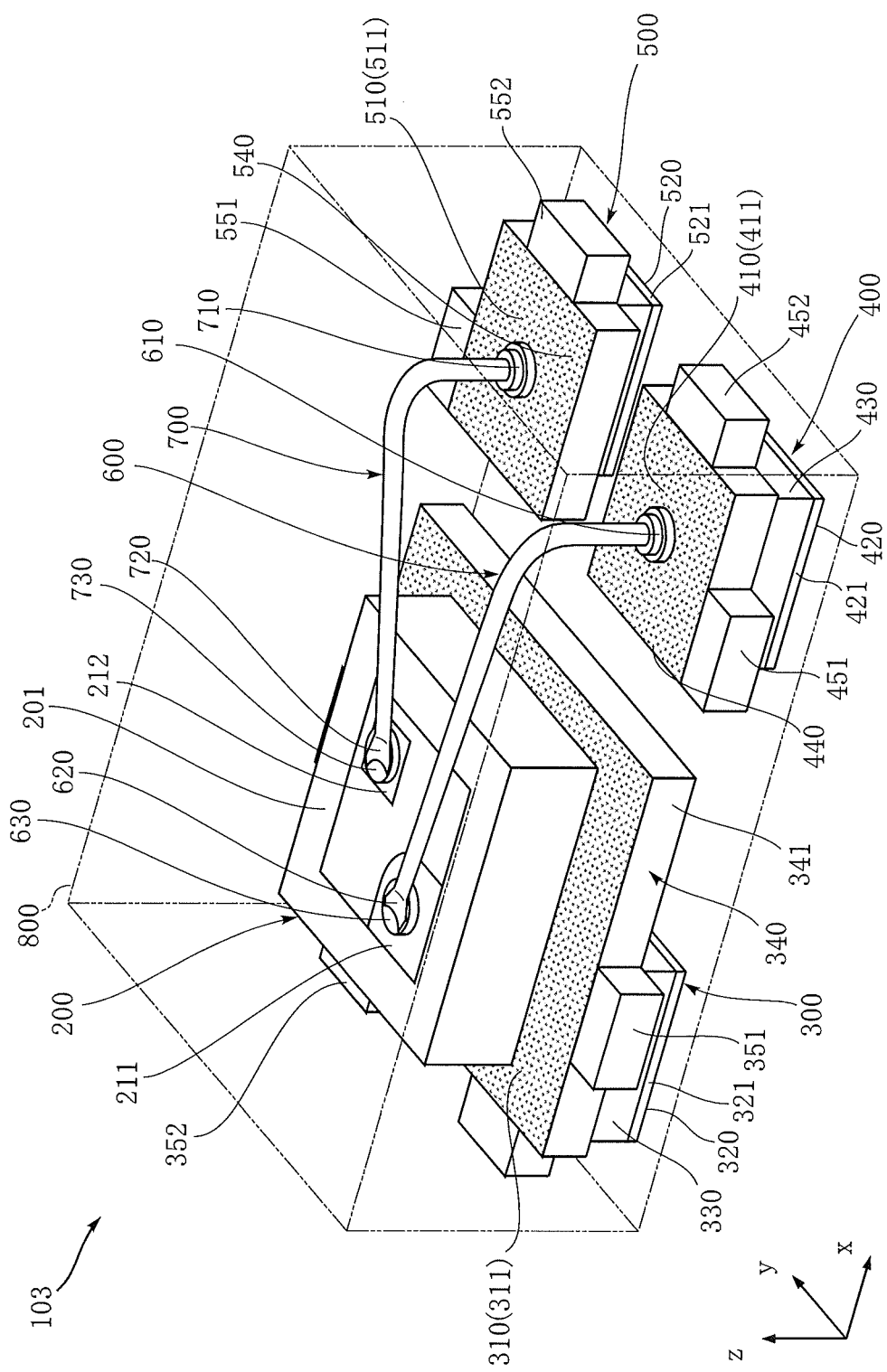
FIG. 16 is a perspective view illustrating a semiconductor device according to a third embodiment of the present invention.
Figure 17:
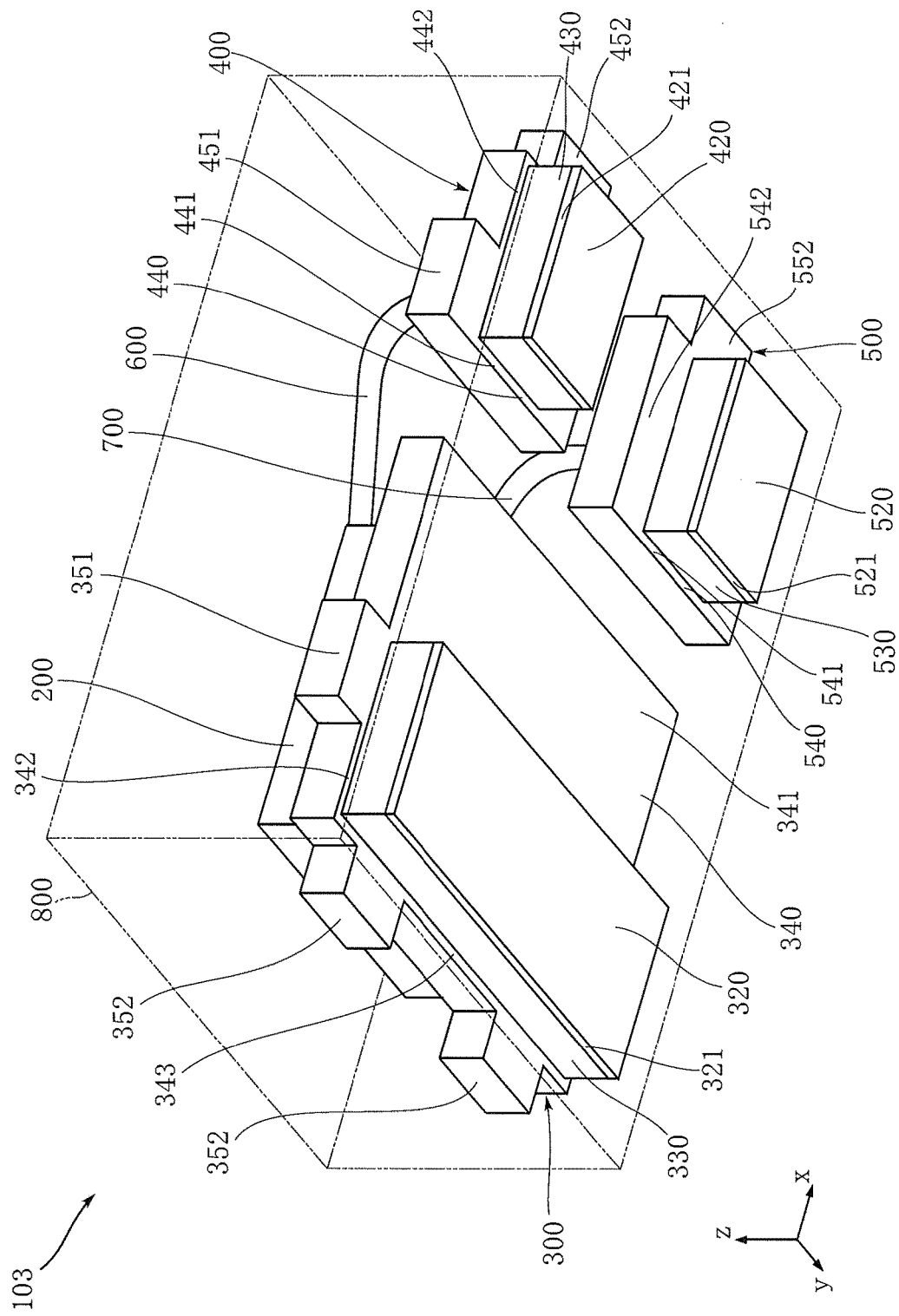
FIG. 17 is a perspective view illustrating a semiconductor device according to a third embodiment of the present invention.

The die pad 310 faces upward in the direction z. The semiconductor element 200 is mounted on the die pad 310. In this embodiment, the die pad 310 is rectangular and about 0.4 mm in dimension in the direction x and about 0.5 mm in dimension in the direction y. The die pad 310 is formed with a main-lead obverse surface plating layer 311. The plating layer 311 is formed over the entire region of the die pad 310. For instance, the plating layer 311 is about 2 μm in thickness and made of Ag. In FIG. 16, the plating layer 311 is illustrated in halftone for easier understanding.

The main-lead reverse surface terminal 320 faces in the opposite direction from die pad 310, i.e., downward in the direction z and is used for surface-mounting the semiconductor device 103. The reverse surface terminal 320 is rectangular and about 0.18 mm in dimension in the direction x and about 0.48 mm in dimension in the direction y. As viewed in the direction z, the entirety of the terminal 320 overlaps the die pad 310 and is contained in the die pad 310. In this embodiment, the main lead 300 is formed with a main-lead reverse surface plating layer 321. The reverse surface plating layer 321 is formed on the main lead 300 at a portion where the reverse surface terminal 320 is to be formed. For instance, the plating layer 321 is about 0.06 mm in thickness and made of Ni, Sn, or an alloy containing these. In this embodiment, the lower surface of the plating layer 321 in the direction z is the terminal 320. The plating layer 321 may not be formed, and the terminal 320 may be provided by the above-described portion made of Cu.

The main lead full-thickness portion 330 extends from the die pad 310 to the main-lead reverse surface terminal 320 in the direction z. In this embodiment, the full-thickness portion 330 refers to the portion made of Cu excluding the main-lead reverse surface plating layer 321 and is about 0.1 mm in thickness. Similarly to the main-lead reverse surface terminal 320, the full-thickness portion 330 is about 0.18 mm in dimension in the direction x and about 0.48 mm in dimension in the direction y.

The main-lead eaved portion 340 projects in the direction x and the direction y perpendicular to the direction z from a portion of the main lead full-thickness portion 330 adjacent to the die pad 310. The upper surface of the eaved portion 340 in the direction z is flush with the full-thickness portion 330. In this embodiment, the eaved portion 340 has a main-lead front portion 341, main-lead side portions 342 and a main-lead rear portion 343. For instance, the thickness of the eaved portion 340 is half the thickness of the full-thickness portion 330 and about 0.05 mm.

The main-lead front portion 341 projects from the main lead full-thickness portion 330 toward the first sublead 400 and the second sublead 500 in the direction x. In this embodiment, the front portion 341 is rectangular and about 0.21 mm in dimension in the direction x and about 0.5 mm in dimension in the direction y.

The main-lead side portions 342 project from the main lead full-thickness portion 330 in the direction y. In this embodiment, two side portions 342 are provided. The side portions 342 are about 0.18 mm in dimension in the direction x and about 0.01 mm in dimension in the direction y. The main lead 300 further includes two main-lead side connecting portions 351. Each of the side connecting portions 351 extends from a corresponding one of the side portions 342 of the eaved portion 320 and has the same thickness as the side portion 342. The end surface of each side connecting portion 351 in the direction y is exposed from the resin package 800. The side connecting portions 351 are about 0.1 mm in dimension in the direction x and about 0.04 mm in dimension in the direction y.

The main-lead rear portion 343 projects from the main-lead full-thickness portion 330 in the direction opposite from the main-lead front portion 341. The rear portion 343 is about 0.01 mm in dimension in the direction x and about 0.5 mm in dimension in the direction y. In this embodiment, the main lead 300 includes two main-lead rear connecting portion 352. The rear connecting portions 352 extend from the rear portion 343 of the main-lead eaved portion 340 and have the same thickness as the rear portion 343. The end surfaces of the rear connecting portions 352 in the direction x are exposed from the resin package 800. Each rear connecting portion 352 is about 0.04 mm in dimension in the direction x and about 0.1 mm in dimension in the direction y.

According to the above-described arrangement, as viewed in the direction z, the entirety of the main-lead full-thickness portion 330 is surrounded by the main-lead eaved portion 340. The upper surfaces of the full-thickness portion 330 and the eaved portion 340 in the direction z provide the die pad 310. The main lead obverse surface plating layer 311 overlaps the entirety of the full-thickness portion 330 and the eaved portion 340. As illustrated in FIG. 18, as viewed in the direction z, about a half part of the semiconductor element 200 overlaps the full-thickness portion 330 and the remaining half of the semiconductor element 200 overlaps the front portion 341 of the main-lead eaved portion 340. The first obverse surface electrode 211 overlaps the full-thickness portion 330, whereas the second obverse surface electrode 212 overlaps the front portion 341 of the eaved portion 340.

As illustrated in FIG. 21, the reverse surface electrode 220 of the semiconductor element 200 is bonded to die pad 310 (main-lead obverse surface plating layer 311). Specifically, the reverse surface electrode 220 as a single metal layer is directly bonded to the plating layer 311 by e.g. thermocompression bonding. In the thermocompression bonding, only heat and pressure are applied and vibration is not applied.

The first sublead 400 is spaced apart from the main lead 300 in the direction x. The first sublead 400 includes a first wire bonding portion 410, a first sublead reverse surface terminal 420, a first sublead full-thickness portion 430 and a first sublead eaved portion 440. Similarly to the main lead 300, the first sublead 400 is derived from a lead frame.

The first wire bonding portion 410 faces upward in the direction z. The first wire 600 is bonded to the first wire bonding portion 410. In this embodiment, the first wire bonding portion 410 is rectangular and about 0.2 mm in dimension in the direction x and about 0.2 mm in dimension in the direction y. The first wire bonding portion 410 is formed with a first sublead obverse surface plating layer 411. The plating layer 411 is formed over the entire region of the first wire bonding portion 410. The plating layer 411 is e.g. about 2 μm in thickness and made of Ag. In FIG. 16, the plating layer 411 is illustrated in halftone for easier understanding.

The first sublead reverse surface terminal 420 faces in the opposite direction from the first wire bonding portion 410, i.e., downward in the direction z and is used for surface-mounting the semiconductor device 103. The reverse surface terminal 420 is rectangular and about 0.18 mm in dimension in the direction x and about 0.13 mm in dimension in the direction y. As viewed in the direction z, the entirety of the reverse surface terminal 420 overlaps the first wire bonding portion 410 and is contained in the first wire bonding portion 410. In this embodiment, the first sublead 400 is formed with a first sublead reverse surface plating layer 421. The reverse surface plating layer 421 is formed on the first sublead 400 at a portion where the reverse surface terminal 420 is to be formed. For instance, the reverse surface plating layer 421 is about 0.06 mm in thickness and made of Ni, Sn, or an alloy containing these. In this embodiment, the lower surface of the reverse surface plating layer 421 in the direction z is the reverse surface terminal 420. The plating layer 421 may not be formed, and the terminal 420 may be provided by the above-described portion made of Cu.

The first sublead full-thickness portion 430 extends from the first wire bonding portion 410 to the first sublead reverse surface terminal 420 in the direction z. In this embodiment, the full-thickness portion 430 refers to the portion made of Cu excluding the first sublead reverse surface plating layer 421 and is about 0.1 mm in thickness. Similarly to the first sublead reverse surface terminal 420, the full-thickness portion 430 is about 0.18 mm in dimension in the direction x and about 0.13 mm in dimension in the direction y.

The first sublead eaved portion 440 projects in the direction x and the direction y perpendicular to the direction z from a portion of the first sublead full-thickness portion 430 adjacent to the first wire bonding portion 410. The upper surface of the eaved portion 440 in the direction z is flush with the full-thickness portion 430. In this embodiment, the eaved portion 440 has a first sublead front portion 441, first sublead side portions 442 and a first sublead rear portion 443. For instance, the thickness of the eaved portion 440 is half the thickness of the full-thickness portion 430 and about 0.05 mm.

The first sublead front portion 441 projects from the first sublead full-thickness portion 430 toward the main lead 300 in the direction x. In this embodiment, the front portion 441 is about 0.01 mm in dimension in the direction x and about 0.2 mm in dimension in the direction y.

The first sublead side portions 442 project from the first sublead full-thickness portion 430 in the direction y. In this embodiment, two side portions 442 are provided. The side portion 442 on the upper side in the direction y in FIG. 18 projects toward the second sublead 500 and is about 0.2 mm in dimension in the direction x and about 0.06 mm in dimension in the direction y. The side portion 442 on the lower side in the direction y in FIG. 18 is about 0.2 mm in dimension in the direction x and about 0.01 mm in dimension in the direction y. The first sublead 400 further includes a first sublead side connecting portion 451. The side connecting portion 451 extends from the side portion 442 of the eaved portion 420 downward in the direction y and has the same thickness as the side portion 442. The end surface of the side connecting portion 451 in the direction y is exposed from the resin package 800. The side connecting portion 451 is about 0.1 mm in dimension in the direction x and about 0.04 mm in dimension in the direction y.

The first sublead rear portion 443 projects from the first sublead full-thickness portion 430 in the direction opposite from the first sublead front portion 441. The rear portion 443 is about 0.01 mm in dimension in the direction x and about 0.14 mm in dimension in the direction y. In this embodiment, the first sublead 400 includes a first sublead rear connecting portion 452. The rear connecting portion 452 extends from the rear portion 443 of the eaved portion 440 and has the same thickness as the rear portion 443. The end surface of the rear connecting portion 452 in the direction x is exposed from the resin package 800. The rear connecting portion 452 is about 0.04 mm in dimension in the direction x and about 0.1 mm in dimension in the direction y.

According to the above-described arrangement, as viewed in the direction z, the entirety of the first sublead full-thickness portion 430 is surrounded by the first sublead eaved portion 440. The upper surfaces of the full-thickness portion 430 and the eaved portion 440 in the direction z provide the first wire bonding portion 410. The first sublead obverse surface plating layer 411 overlaps the entirety of the full-thickness portion 430 and the eaved portion 440.

The second sublead 500 is aligned with the first sublead 400 in the direction y and spaced apart from the main lead 300 in the direction x. The second sublead includes a second wire bonding portion 510, a second sublead reverse surface terminal 520, a second sublead full-thickness portion 530 and a second sublead eaved portion 540. Similarly to the main lead 300 and the first sublead 400, the second sublead 500 is derived from the lead frame.

The second wire bonding portion 510 faces upward in the direction z. The second wire 700 is bonded to the second wire bonding portion 510. In this embodiment, the second wire bonding portion 510 is rectangular and about 0.2 mm in dimension in the direction x and about 0.2 mm in dimension in the direction y. The second wire bonding portion 510 is formed with a second sublead obverse surface plating layer 511. The plating layer 511 is formed over the entire region of the second wire bonding portion 510. The plating layer 511 is e.g. about 2 μm in thickness and made of Ag. In FIG. 16, the second sublead obverse surface plating layer 511 is illustrated in halftone for easier understanding.

The second sublead reverse surface terminal 520 faces in the opposite direction from the second wire bonding portion 510, i.e., faces downward in the direction z. The second sublead reverse surface terminal 520 is used for surface-mounting the semiconductor device 103. The reverse surface terminal 520 is rectangular and about 0.18 mm in dimension in the direction x and about 0.13 mm in dimension in the direction y. As viewed in the direction z, the entirety of the reverse surface terminal 520 overlaps the second wire bonding portion 510 and is contained in the second wire bonding portion 510. In this embodiment, the second sublead 500 is formed with a second sublead reverse surface plating layer 521. The reverse surface plating layer 521 is formed on the second sublead 500 at a portion where the reverse surface terminal 520 is to be formed. For instance, the reverse surface plating layer 521 is about 0.06 mm in thickness and made of Ni, Sn, or an alloy containing these. In this embodiment, the lower surface of the reverse surface plating layer 521 in the direction z is the reverse surface terminal 520. The plating layer 521 may not be formed, and the terminal 520 may be provided by the above-described portion made of Cu.

The second sublead full-thickness portion 530 extends from the second wire bonding portion 510 to the second sublead reverse surface terminal 520 in the direction z. In this embodiment, the full-thickness portion 530 refers to the portion made of Cu excluding the second sublead reverse surface plating layer 521 and is about 0.1 mm in thickness. Similarly to the second sublead reverse surface terminal 520, the full-thickness portion 530 is about 0.18 mm in dimension in the direction x and about 0.13 mm in dimension in the direction y.

The second sublead eaved portion 540 projects in the direction x and the direction y perpendicular to the direction z from a portion of the second sublead full-thickness portion 530 adjacent to the second wire bonding portion 510. The upper surface of the eaved portion 540 in the direction z is flush with the full-thickness portion 530. In this embodiment, the eaved portion 540 has a second sublead front portion 541, second sublead side portions 542 and a second sublead rear portion 543. For instance, the thickness of the eaved portion 540 is half the thickness of the full-thickness portion 530 and about 0.05 mm.

The second sublead front portion 541 projects from the second sublead full-thickness portion 530 toward the main lead 300 in the direction x. In this embodiment, the front portion 541 is about 0.01 mm in dimension in the direction x and about 0.2 mm in dimension in the direction y.

The second sublead side portions 542 project from the second sublead full-thickness portion 530 in the direction y. In this embodiment, two side portions 542 are provided. The side portion 542 on the lower side in the direction y in FIG. 18 projects toward the first sublead 400 and is about 0.2 mm in dimension in the direction x and about 0.06 mm in dimension in the direction y. The side portion 542 on the upper side in the direction y in FIG. 18 is about 0.2 mm in dimension in the direction x and about 0.01 mm in dimension in the direction y. In this embodiment, the second sublead 500 further includes a second sublead side connecting portion 551. The side connecting portion 551 extends from the side portion 542 of the eaved portion 540 upward in the direction y in FIG. 18 and has the same thickness as the side portion 542. The end surface of the side connecting portion 551 in the direction y is exposed from the resin package 800. The side connecting portion 551 is about 0.1 mm in dimension in the direction x and about 0.04 mm in dimension in the direction y.

The second sublead rear portion 543 projects from the second sublead full-thickness portion 530 in the direction opposite from the second sublead front portion 541. The rear portion 543 is about 0.01 mm in dimension in the direction x and about 0.14 mm in dimension in the direction y. In this embodiment, the second sublead 500 includes a second sublead rear connecting portion 552. The rear connecting portion 552 extends from the rear portion 543 of the eaved portion 540 and has the same thickness as the rear portion 543. The end surface of the rear connecting portion 552 in the direction x is exposed from the resin package 800. The rear connecting portion 552 is about 0.04 mm in dimension in the direction x and about 0.1 mm in dimension in the direction y.

In this arrangement, as viewed in the direction z, the entirety of the second sublead full-thickness portion 530 is surrounded by the second sublead eaved portion 540. The upper surfaces of the full-thickness portion 530 and eaved portion 540 in the direction z provide the second wire bonding portion 510. The second sublead obverse surface plating layer 511 overlaps the entirety of the full-thickness portion 530 and the eaved portion 540.

The first wire 600 is bonded to the first obverse surface electrode 211 of the semiconductor element 200 and the first wire bonding portion 410 of the first sublead 400. The first wire 600 has a first bonding portion 610 and a second bonding portion 620. The first wire 600 is about 20 μm in diameter and made of Au.

The first bonding portion 610 is bonded to the first wire bonding portion 410 of the first sublead 400 and has a crown-like lump portion. The second bonding portion 620 is bonded to the first obverse surface electrode 211 of the semiconductor element 200 via a first bump 630. The second bonding portion 620 has a tapered shape and the thickness in the direction z reduces as proceeding toward the end. The first bump 630 is similar to the lump portion of the first bonding portion 610. In this embodiment, the volume of the first bump 630 is slightly smaller than that of the lump portion of the first bonding portion 610.

The second wire 700 is bonded to the second obverse surface electrode 212 of the semiconductor element 200 and the second wire bonding portion 510 of the second sublead 500. The second wire 700 has a first bonding portion 710 and a second bonding portion 720. The second wire 700 is about 20 μm in diameter and made of Au.

The first bonding portion 710 is bonded to the second wire bonding portion 510 of the second sublead 500 and has a crown-like lump portion. The second bonding portion 720 is bonded to the second obverse surface electrode 212 of the semiconductor element 200 via a second bump 730. The second bonding portion 720 has a tapered shape and the thickness in the direction z reduces as proceeding toward the end. The second bump 730 is similar to the lump portion of the first bonding portion 710. In this embodiment, the volume of the second bump 730 is slightly smaller than that of the lump portion of the first bonding portion 710.

The resin package 800 is made of e.g. black epoxy resin and covers the semiconductor element 200 and portions of the main lead 300, first sublead 400 and second sublead 500. The resin package 800 exposes the reverse surface terminal 320 of the main lead 300, the reverse surface terminal 420 of the first sublead 400 and the reverse surface terminal 520 of the second sublead 500 to the lower side in the thickness direction z. In this embodiment, the distance between the upper ends of the first wire 600 and the second wire 700 in the direction z and the upper end of the resin package 800 in the direction z is about 50 μm.

Figure 26:
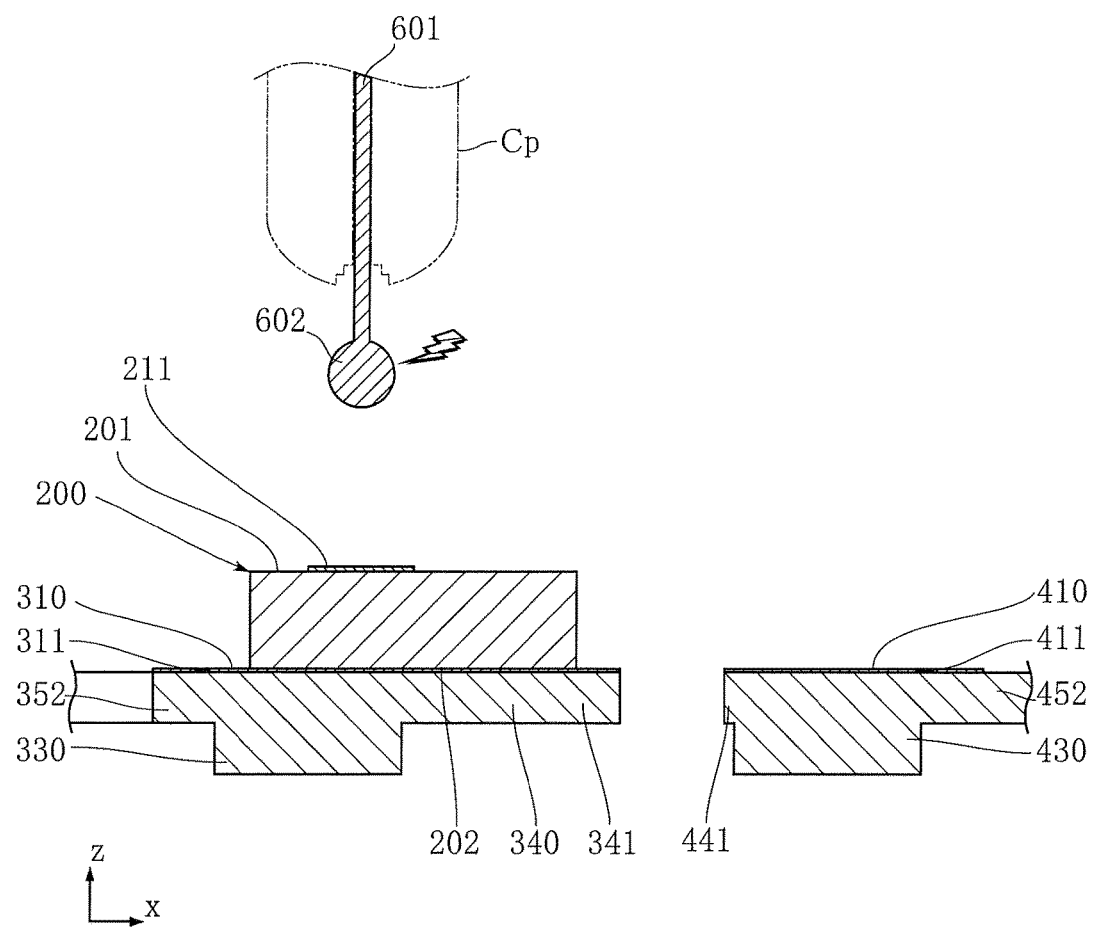
FIG. 26 is a sectional view illustrating a step of a method for making the semiconductor device of the third embodiment.

An example of a method for making the semiconductor device 103 is described below with reference to FIGS. 26-33. Only the process for bonding the first wire 600 is described with reference to FIGS. 26-32. The second wire 700 is bonded in a similar way. First, as illustrated in FIG. 26, the semiconductor element 200 is bonded to the main lead 300. In this step, the manufacturing efficiency is enhanced by using a lead frame including a plurality of main leads 300, first subleads 400 and second subleads 500. With a wire 601 exposed from the end of a capillary Cp, a spark is generated directly above the first obverse surface electrode 211 of the semiconductor element 200. Thus, a ball 602 is formed at the end of the wire 601. The wire 601 is about 20 μm in diameter and made of Au.

Figure 27:
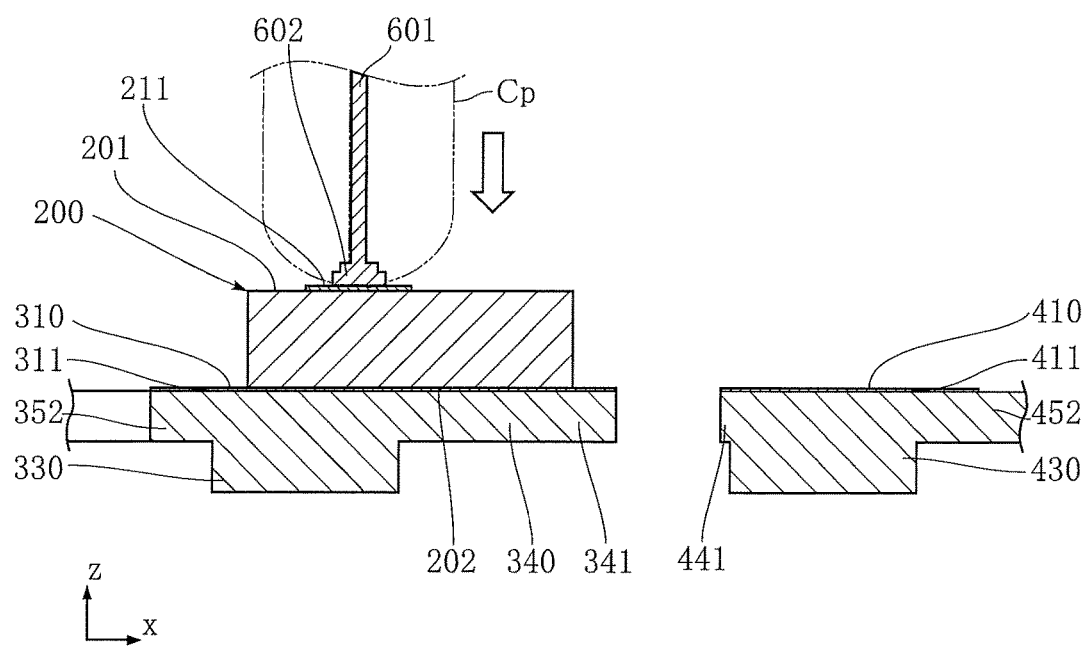
FIG. 27 is a sectional view illustrating a step of a method for making the semiconductor device of the third embodiment.
Figure 28:
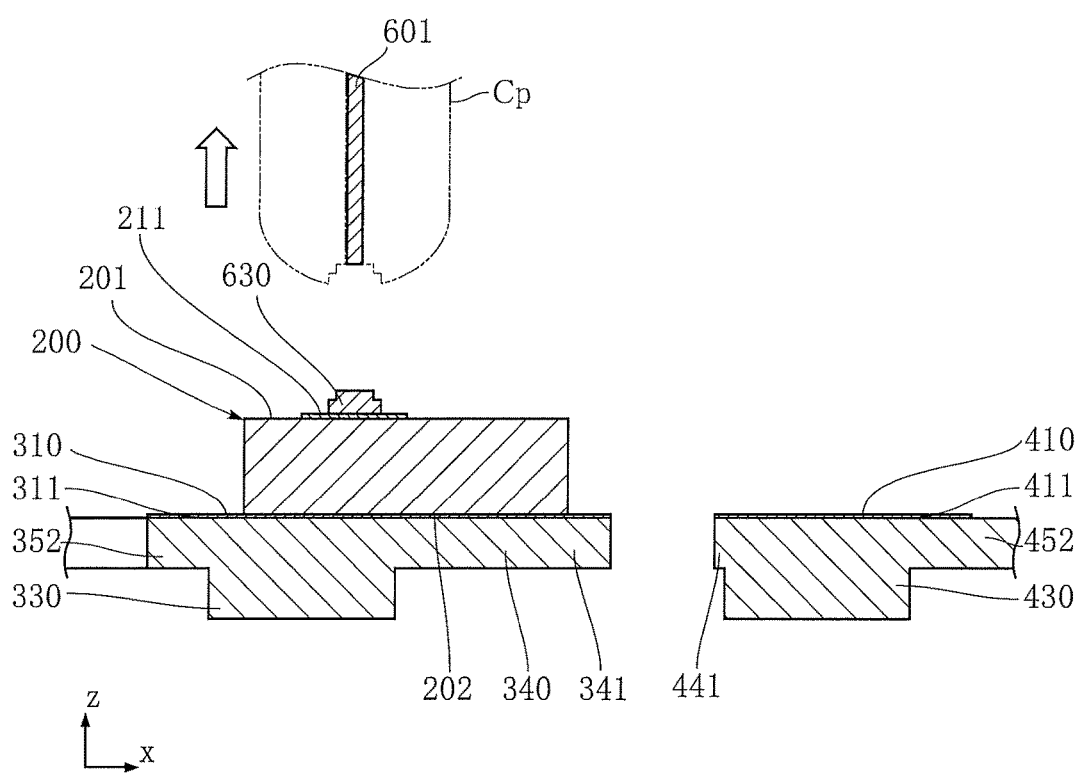
FIG. 28 is a sectional view illustrating a step of a method for making the semiconductor device of the third embodiment.

Then, as illustrated in FIG. 27, the capillary Cp is moved downward, whereby the ball 602 is bonded to the first obverse surface electrode 211 of the semiconductor element 200. Then, with the wire 601 fixed relative to the capillary Cp, the capillary Cp is moved upward. Thus, as illustrated in FIG. 28, a first bump 630 is formed on the first obverse surface electrode 211.

Figure 29:
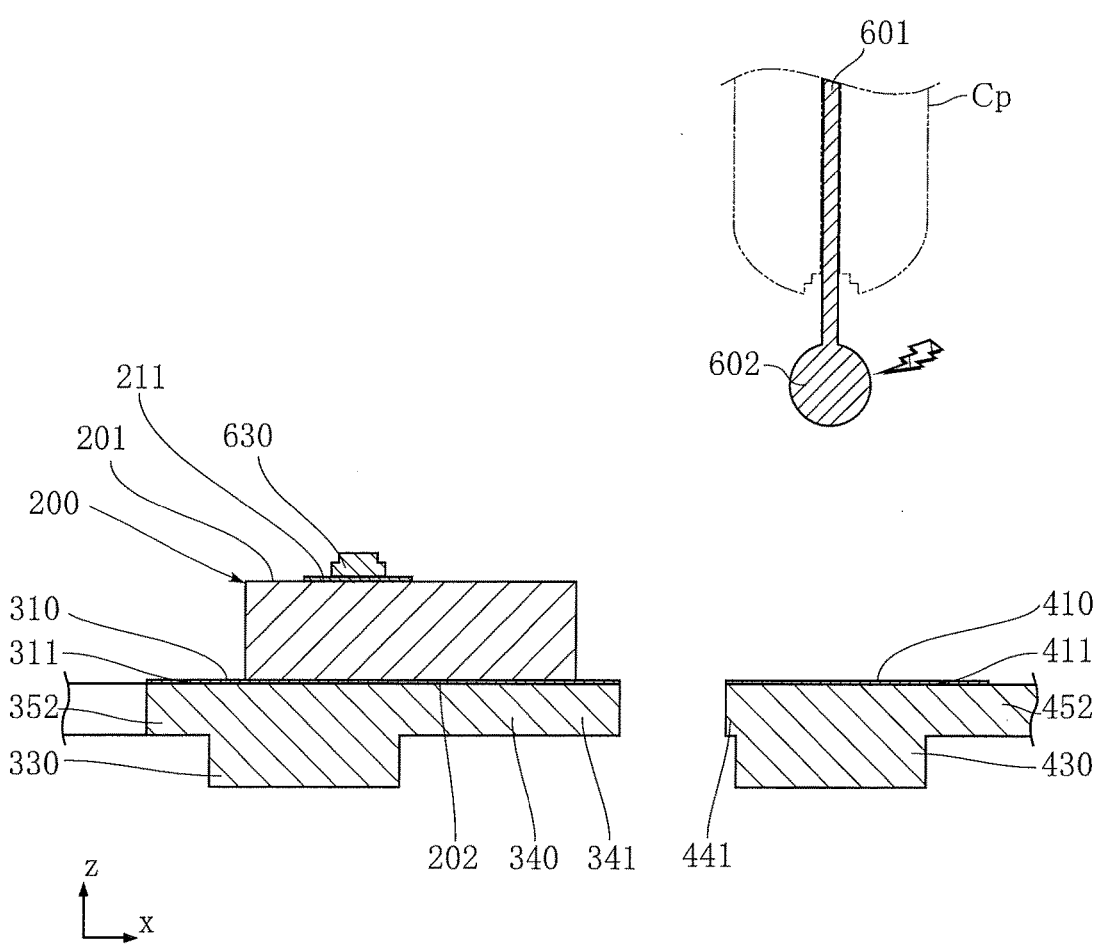
FIG. 29 is a sectional view illustrating a step of a method for making the semiconductor device of the third embodiment.
Figure 30:
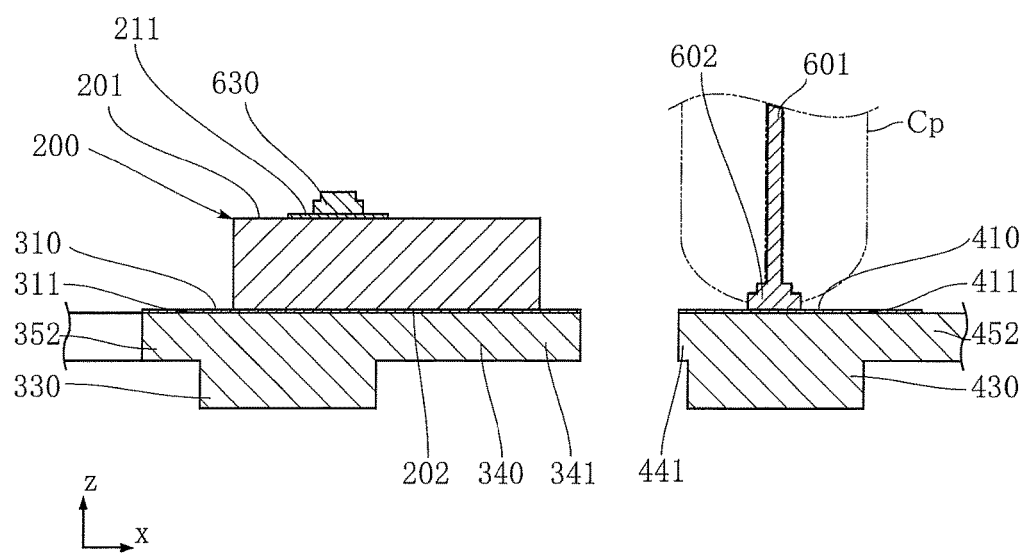
FIG. 30 is a sectional view illustrating a step of a method for making the semiconductor device of the third embodiment.

Then, as illustrated in FIG. 29, a new ball 602 is formed at the end of the wire 601 by generating a spark directly above the first wire bonding portion 410 of the first sublead 400. Then, as illustrated in FIG. 30, the capillary Cp is moved downward, whereby the ball 602 is bonded to the first wire bonding portion 410 of the first sublead 400.

Figure 31:
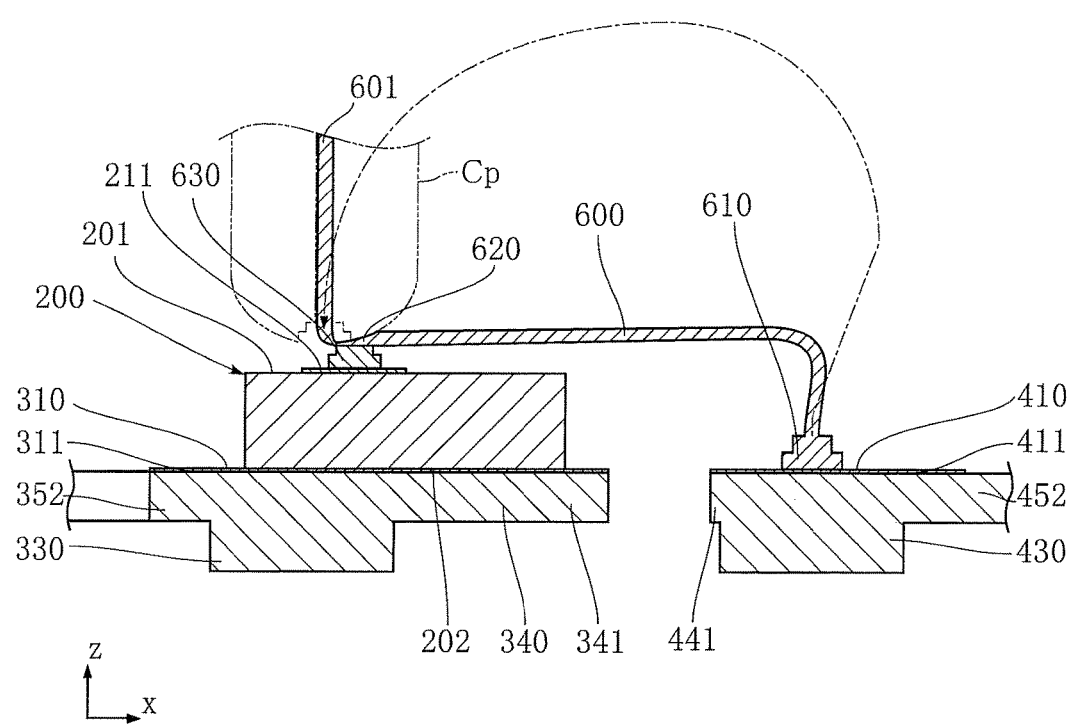
FIG. 31 is a sectional view illustrating a step of a method for making the semiconductor device of the third embodiment.
Figure 32:
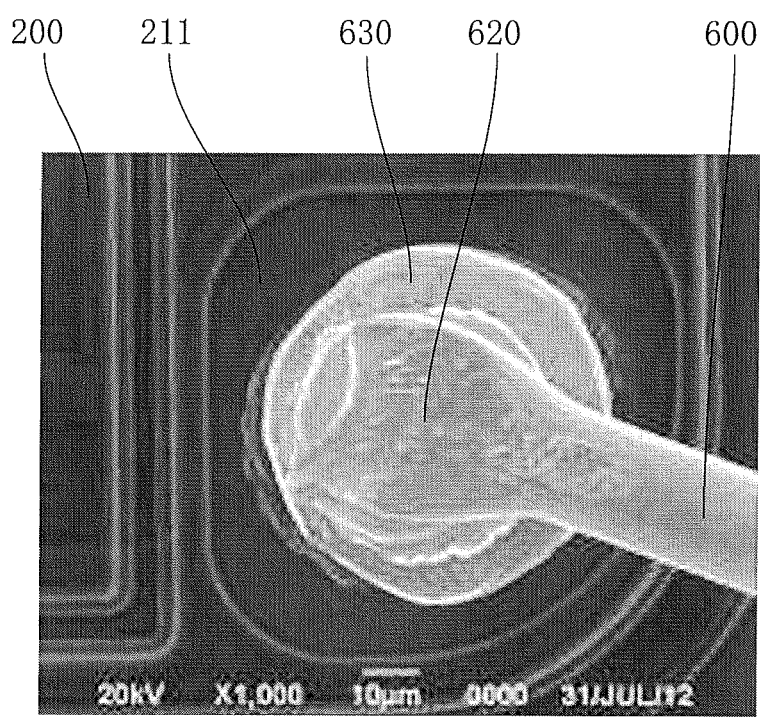
FIG. 32 is an enlarged image of a second bonding portion of the semiconductor device of the third embodiment.

Then, with the wire 601 unfixed relative to the capillary Cp, the capillary Cp is moved along the path indicated by double-dashed lines in FIG. 31. Thus, while the first bonding portion 610 is formed, the wire 601 is bent at a predetermined height and extended in the horizontal direction. Then, the end of the capillary Cp is pressed against the first bump 630. In this process, the wire 601 is sandwiched between the capillary Cp and the first bump 630, and the sandwiched portion is bonded to the first bump 630. (Alternatively, for instance, heat and vibration may be applied to the portion to be bonded via a support base, not shown, supporting the main lead 300). Then, with the wire 601 fixed relative to the capillary Cp, the capillary Cp is separated from the semiconductor element 200. In this way, the second bonding portion 620 is formed. FIG. 32 is an enlarged image of the second bonding portion 620 and the first bump 630 captured from above in the direction z. As shown in the figure, the second bonding portion 620 that is slightly widened is bonded onto the first bump 630 that is circular as viewed in plan.

Figure 33:
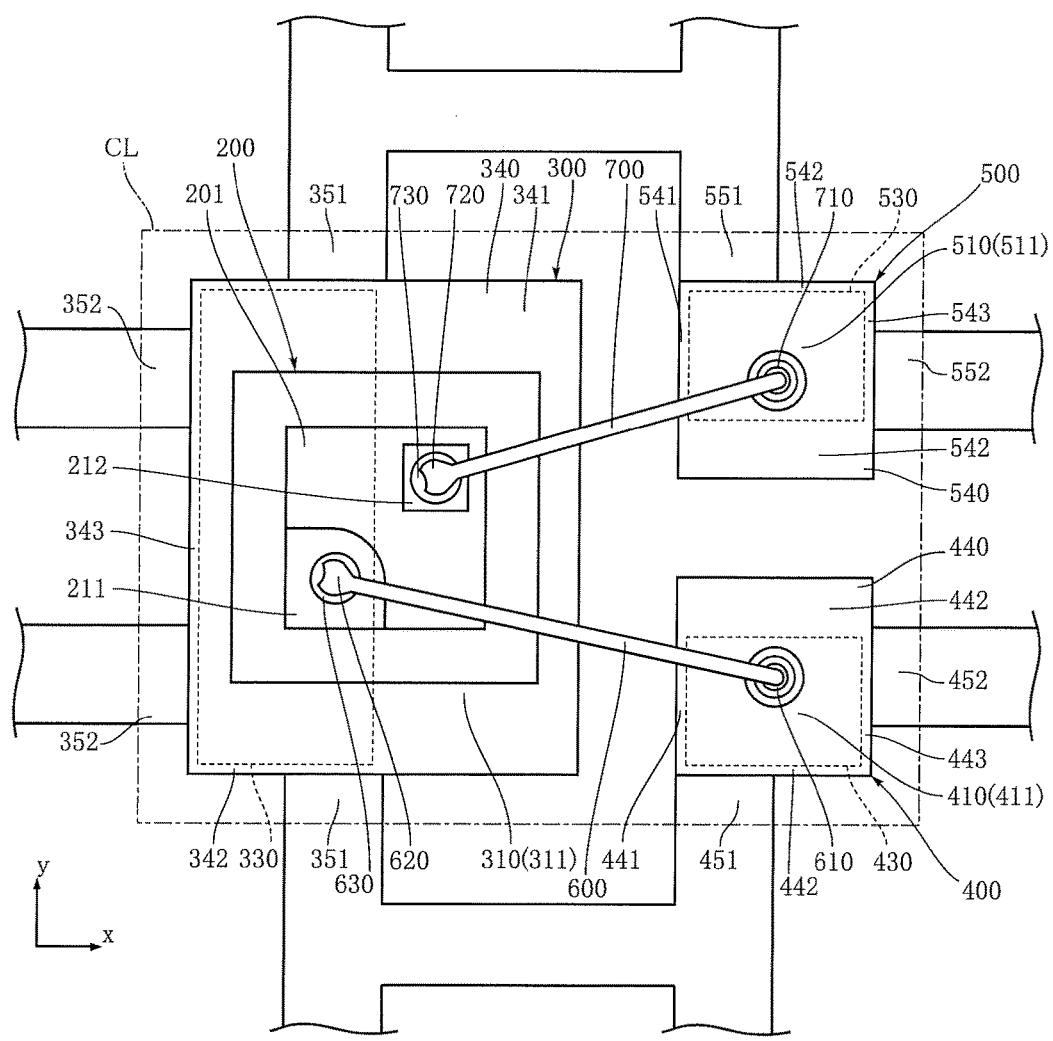
FIG. 33 is a plan view illustrating a cutting step of a method for making the semiconductor device of the third embodiment.

Then, the second wire 700 is bonded in the same way as the first wire. Thereafter, a resin member in the form of a plate is made using e.g. a black epoxy resin so as to cover the semiconductor element 200, the first wire 600, the second wire 700 and a part of each of the main lead 300, first sublead 400 and second sublead 500. FIG. 33 illustrates the above-described lead frame, semiconductor element 200, first wire 600 and second wire 700. These elements are covered by the above-described resin member (not shown). By cutting the resin member and the lead frame collectively along the cutting line CL in the figure, the semiconductor device 103 illustrated in FIGS. 16-24 is obtained.

Advantages of the semiconductor device 103 are described below.

In this embodiment, the die pad 310 and the semiconductor element 200 overlap both of the main-lead full-thickness portion 330 and main-lead eaved portion 340 as viewed in the direction z. The eaved portion 340 functions to enhance the bonding strength between the main lead 300 and the resin package 800. In this embodiment, the main lead 300 does not project excessively from the semiconductor element 200, so that the dimension of the semiconductor device 103 as viewed in the direction z is reduced. The dimension of the semiconductor device 103 in the direction z can be reduced by arranging at least one of the first obverse surface electrode 211 and the second obverse surface electrode 212 in such a manner as to overlap the main-lead eaved portion 340. In this embodiment, the second bonding portion 620 of the first wire 600 is bonded to the first obverse surface electrode 211 via the first bump 630, and the second bonding portion 720 of the second wire 700 is bonded to the second obverse surface electrode 212 via the second bump 730. By this arrangement, each of the second bonding portions is properly fixed to a corresponding one of the obverse surface electrodes.

Figure 19:
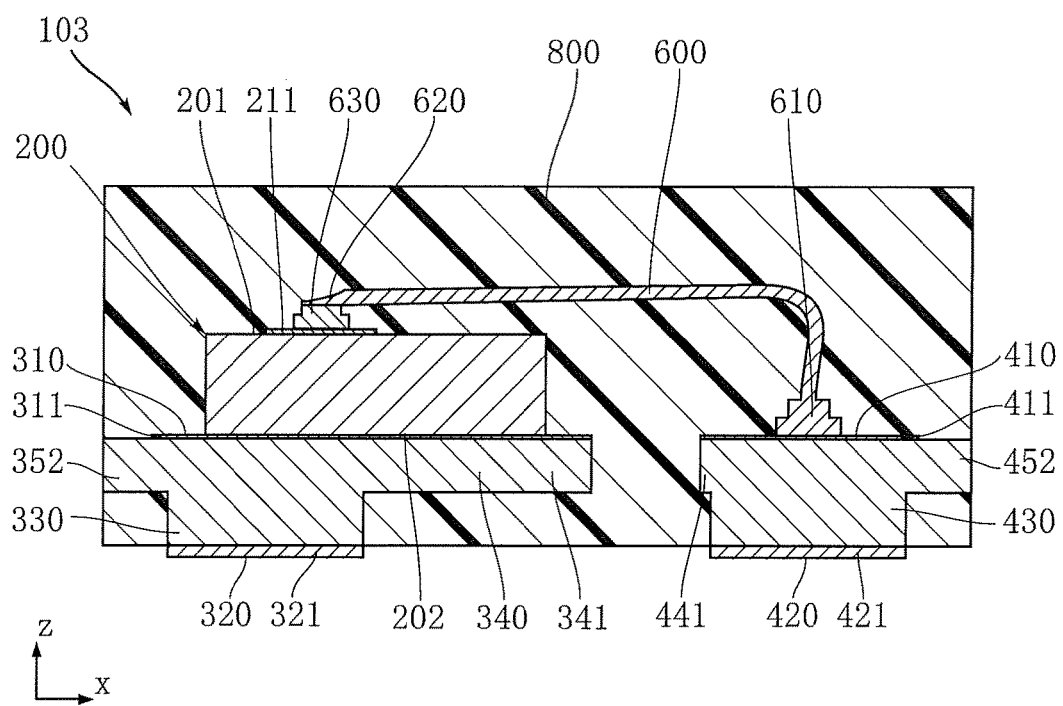
FIG. 19 is a sectional view taken along XIX-XIX in FIG. 18.
Figure 20:
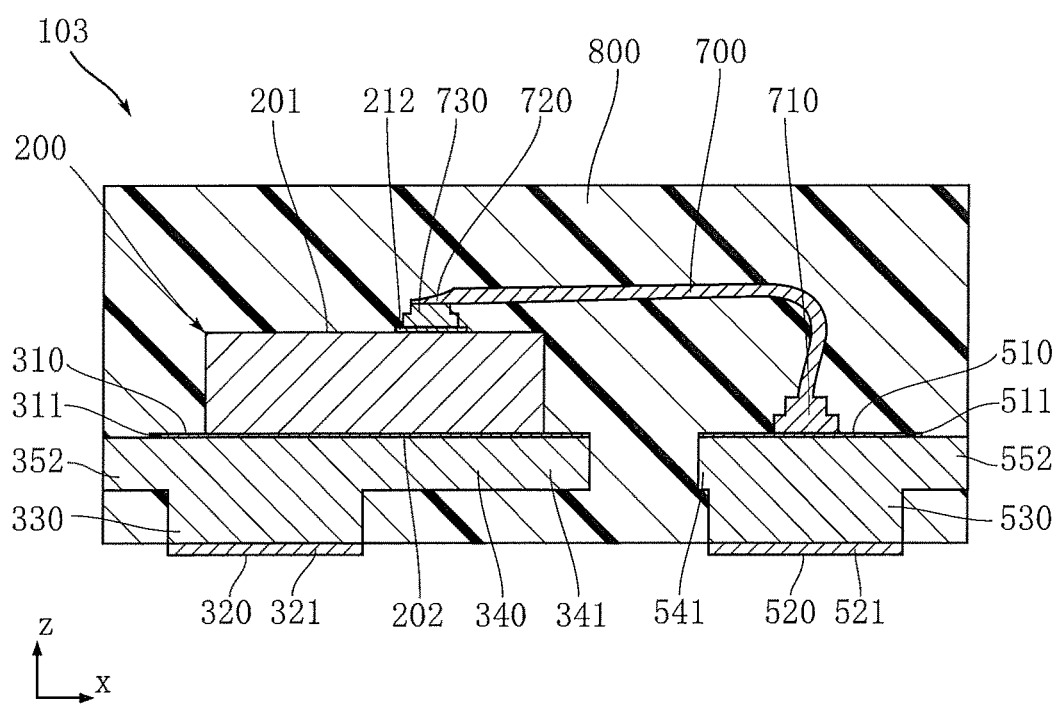
FIG. 20 is a sectional view taken along XX-XX in FIG. 18.

As illustrated in FIGS. 19 and 20, the first wire 600 and the second wire 700 include portions that extend from the corresponding second bonding portions 620, 720 generally straight in the lateral direction (the direction x) and do not include an arcuate portion projecting upward at a position higher than the second bonding portions. By this arrangement, the heights of the first wire 600 and the second wire 700 in the direction z are reduced. This contributes to reduction in size of the semiconductor device 103 in the direction z.

The first obverse surface electrode (gate electrode) 211 is positioned further away from the first sublead 400 and the second sublead 500 than the second obverse surface electrode (source electrode) 212 is. Thus, the first wire 600 can be made longer than the second wire 700. The longer first wire 600 can be easily bonded to the bonding portion (second bonding portion 620 in particular) with higher bonding strength. Generally, the gate electrode (the first obverse surface electrode 211 in this embodiment) is formed on a relatively smooth surface of the semiconductor layer via an insulating layer. Thus, it is relatively difficult to bond a wire onto the gate electrode with a high bonding strength. On the other hand, the source electrode (the second obverse surface electrode 212 in this embodiment) is connected to a metal portion filling a plurality of trenches (vertical holes) formed in a semiconductor layer. Owing to this arrangement, it is relatively easy to bond a wire onto the source electrode with a high bonding strength. Thus, bonding the first wire 600, which can be bonded with a higher bonding strength, to the first obverse surface electrode 211 (gate electrode), which is likely to lack the wire bonding strength, is advantageous for preventing wire separation.

Since the first obverse surface electrode 211 overlaps the main-lead full-thickness portion 330 as viewed in the direction z, as described with reference to FIGS. 27 and 31, the capillary Cp can be reliably pressed against the first obverse surface electrode 211 as a gate electrode, which is likely to lack bonding strength. The second obverse surface electrode 212 as a source electrode for which the bonding strength is enhanced relatively easily is arranged at a position overlapping the main-lead eaved portion 340 as viewed in the direction z. This arrangement allows reduction in dimension of the semiconductor device 103 as viewed in the direction z.

Since the main-lead eaved portion 340 has the front portion 341, the bonding strength between the main lead 300 and the resin package 800 is enhanced. Moreover, while the distance between the semiconductor element 200 and the first sublead 400 or the second sublead 500 is reduced, the main-lead reverse surface terminal 320 is prevented from being positioned too close to the first sublead reverse surface terminal 420 and the second sublead reverse surface terminal 520.

Since the main-lead eaved portion 340 has side portions 342 and the rear portion 343, the bonding strength between the main lead 300 and the resin package 800 is enhanced. The arrangement in which the entirety of the main-lead full-thickness portion 330 is surrounded by the main-lead eaved portion 340 is advantageous for enhancing the bonding strength between the main lead 300 and the resin package 800.

The main-lead side connecting portions 351 and the main-lead rear connecting portion 352 hold the main lead 300 properly during the process for manufacturing the semiconductor device 103. The end surface of the main-lead side connecting portion 351 in the direction y and the end surface of the main-lead rear connecting portion 352 in the direction x are spaced apart from the main-lead reverse surface terminal 320 though exposed from the resin package 800. Thus, solder for surface-mounting the semiconductor device 103 does not spread onto the end surface of the main-lead side connecting portion 351 in the direction y and the end surface of the main-lead rear connecting portion 352 in the direction x.

Since the main-lead obverse surface plating layer 311 is formed on the die pad 310, the bonding strength between the reverse surface electrode 220 of the semiconductor element 200 and the die pad 310 is enhanced. Since the main-lead obverse surface plating layer 311 overlaps the entirety of the main-lead eaved portion 340, a large area can be used as the die pad 310.

Since the first sublead 400 has the first sublead eaved portion 440, the bonding strength between the first sublead 400 and the resin package 800 is enhanced. Since the first sublead eaved portion 440 has the front portion 441, the first sublead reverse surface terminal 420 is prevented from being positioned too close to the main-lead reverse surface terminal 320, while enhanced bonding strength with the resin package 800 is provided.

Since the first sublead eaved portion 440 has the first sublead side portions 442 and the first sublead rear portion 443, the bonding strength between the first sublead 400 and the resin package 800 is enhanced. The arrangement in which the entirety of the first sublead full-thickness portion 430 is surrounded by the first sublead eaved portion 440 is advantageous for enhancing the bonding strength between the first sublead 400 and the resin package 800. Since the side portion 442 closer to the second sublead 500 is relatively large, the first sublead reverse surface terminal 420 and the second sublead reverse surface terminal 520 are prevented from being positioned too close to each other, while enhanced bonding strength is provided.

The first sublead side connecting portions 451 and the first sublead rear connecting portion 452 hold the first sublead 400 properly during the process for manufacturing the semiconductor device 103. The end surface of the side connecting portion 451 in the direction y and the end surface of the rear connecting portion 452 in the direction x are spaced apart from the first sublead reverse surface terminal 420 though exposed from the resin package 800. Thus, solder for surface-mounting the semiconductor device 103 does not spread onto the end surface of the side connecting portion 451 in the direction y and the end surface of the rear connecting portion 452 in the direction x.

Since the first sublead obverse surface plating layer 411 is formed on the first wire bonding portion 410, the bonding strength between the first wire 600 and the first wire bonding portion 410 is enhanced.

Since the second sublead 500 has the second sublead eaved portion 540, the bonding strength between the second sublead 500 and the resin package 800 is enhanced. Since the second sublead eaved portion 540 has the front portion 541, the second sublead reverse surface terminal 520 is prevented from being positioned too close to the main-lead reverse surface terminal 320, while enhanced bonding strength with the resin package 800 is provided.

Since the second sublead eaved portion 540 has the second sublead side portions 542 and the second sublead rear portion 543, the bonding strength between the second sublead 500 and the resin package 800 is enhanced. The arrangement in which the entirety of the second sublead full-thickness portion 530 is surrounded by the second sublead eaved portion 540 is advantageous for enhancing the bonding strength between the second sublead 500 and the resin package 800. Since the side portion 542 closer to the first sublead 400 is relatively large, the second sublead reverse surface terminal 520 and the first sublead reverse surface terminal 420 are prevented from being positioned too close to each other, while enhanced bonding strength is provided.

The second sublead side connecting portions 551 and the second sublead rear connecting portion 552 hold the second sublead 500 properly during the process for manufacturing the semiconductor device 103. The end surface of the side connecting portion 551 in the direction y and the end surface of the rear connecting portion 552 in the direction x are spaced apart from the second sublead reverse surface terminal 520 though exposed from the resin package 800. Thus, solder for surface-mounting the semiconductor device 103 does not spread on the end surface of the side connecting portion 551 in the direction y and the end surface of the rear connecting portion 552 in the direction x.

Since the second sublead obverse surface plating layer 511 is formed on the second wire bonding portion 510, the bonding strength between the second wire 700 and the second wire bonding portion 510 is enhanced.

The semiconductor element 200 is bonded to the die pad 310 of the main lead 300 by directly bonding the reverse surface electrode 220 made of a single metal layer to the main-lead obverse surface plating layer 311, and vibration is not applied in the bonding process. Thus, it is not necessary to provide the main lead 300 with an extra region around the semiconductor element 200 in consideration for the application of vibration. This is advantageous for size reduction of the semiconductor device 103.

Figure 34:
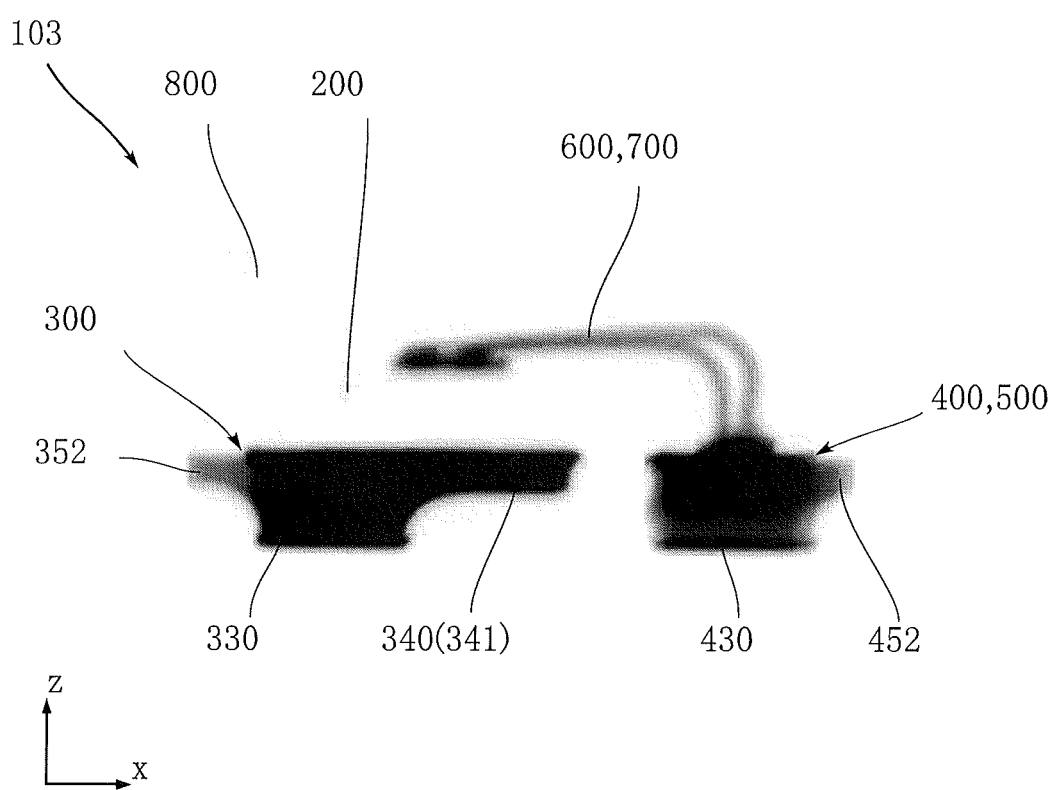
FIG. 34 is an X-ray image of the semiconductor device of the third embodiment.

FIG. 34 is an X-ray image of the semiconductor device 103. As shown in the figure, when the main lead 300 and the first and the second subleads 400, 500 are pattern-formed by etching, the boundary between the main-lead full-thickness portion 330 and the main-lead eaved portion 340 can be a curved surface. Similarly, the boundary between the first sublead full-thickness portion 430 and the first sublead eaved portion 440 or the boundary between the second sublead full-thickness portion 530 and the second sublead eaved portion 540 can be a curved surface. In making a very small semiconductor device, such a curved surface tends to be formed inevitably during the etching process, against the intention of design (see configuration illustrated in FIGS. 16-24).

Figure 35:
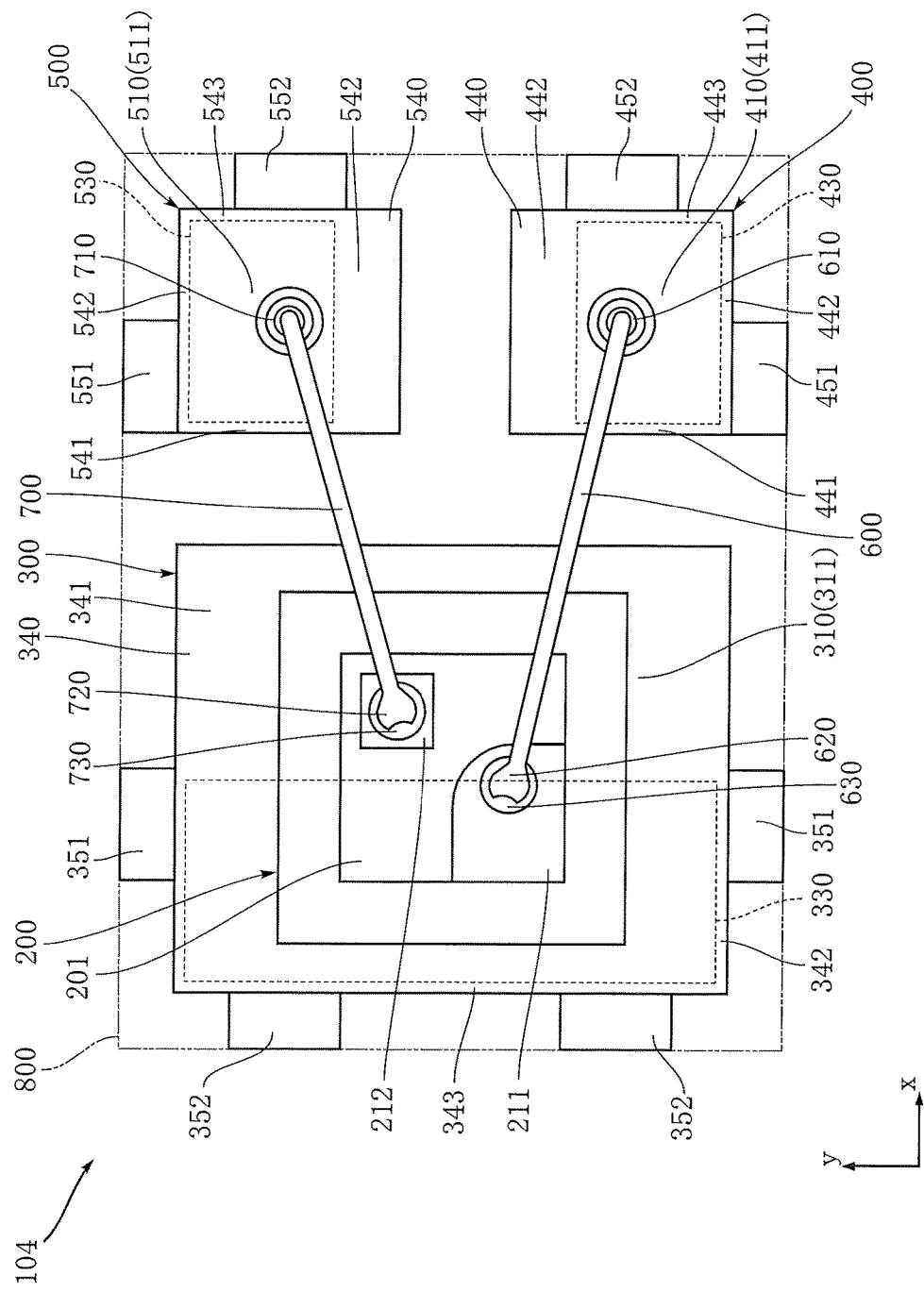
FIG. 35 is a plan view illustrating a semiconductor device according to a fourth embodiment of the present invention.

FIG. 35 illustrates a semiconductor device 104 according to a fourth embodiment of the present invention. In this figure, the elements that are identical or similar to those of the third embodiment are designated by the same reference signs as those used for the third embodiment.

In this embodiment, the first obverse surface electrode 211 overlaps both of the main-lead full-thickness portion 330 and the main-lead eaved portion 340 as viewed in the direction z. As viewed in the direction z, the first bump 630 and the second bonding portion 620 of the first wire 600 overlap both of the full-thickness portion 330 and the eaved portion 340. In this figure, a chain line extending in the direction y crosses the first bump 630 and the second bonding portion 620 of the first wire 600. This chain line is the boundary between the full-thickness portion 330 and the eaved portion 340 as viewed in the direction z. According to this embodiment again, size reduction of the semiconductor device 104 is achieved.

The semiconductor device according to the present invention is not limited to the foregoing embodiments. The specific structure of each part of the semiconductor device according to the present invention can be varied in design in many ways. For instance, the semiconductor element used for the semiconductor device according to the present invention is not limited to a transistor, and various kinds of semiconductor elements having two surface electrodes can be employed.

The invention claimed is:

1. A semiconductor device comprising:
   a semiconductor element provided with a first electrode and a second electrode;
   a main lead on which the semiconductor element is disposed;

a first sublead facing the main lead;
a first wire having a first end and a second end that are connected to the first electrode and the first sublead, respectively;
a second wire having a first end and a second end, the first end of the second wire being connected to the second electrode, the second wire being disposed on a left side of the first wire as viewed in a thickness direction of the semiconductor element as proceeding along the first wire from the first electrode toward the first sublead;
a resin package covering the semiconductor element, the main lead, the first sublead, the first wire and the second wire, the resin package having a rectangular shape as viewed in the thickness direction of the semiconductor element,
wherein the resin package has a first surface and a second surface, the first surface having a normal direction parallel to the thickness direction, the second surface having a normal direction perpendicular to the thickness direction,
the main lead and the first sublead are exposed from the first surface of the resin package,
the main lead and the first sublead have a first portion and a second portion, respectively, that are exposed from the second surface of the resin package,
as viewed in the thickness direction of the semiconductor element, the first end of the second wire is offset toward the first sublead with respect to the first end of the first wire in a first direction parallel to the second surface of the resin package.

2. The semiconductor device according to claim 1, wherein the main lead comprises a first side projection and a second side projection that extend mutually opposite in a second direction perpendicular to the first direction as viewed in the thickness direction of the semiconductor element,
the first end of the first wire is aligned with the first side projection and the second side projection along the second direction.

3. The semiconductor device according to claim 1, wherein the main lead comprises a first rear projection and a second rear projection that are disposed on a side opposite to the first sublead and spaced apart from each other in the second direction,
the first end of the first wire and the first end of the second wire are each disposed between the first rear projection and the second rear projection in the second direction.

4. The semiconductor device according to claim 1, wherein the semiconductor element includes a part that does not overlap with the main lead as viewed in the thickness direction.

5. The semiconductor device according to claim 1, wherein the main lead has a main-lead obverse surface and a main-lead reverse surface,
the semiconductor element is disposed on the main-lead obverse surface, and the main-lead reverse surface is exposed from the first surface of the resin package.

6. The semiconductor device according to claim 5, wherein the main lead includes a main-lead full-thickness portion and a main-lead eaved portion, the main-lead full-thickness portion extending from the main-lead obverse surface to the main-lead reverse surface, the main-lead eaved portion projecting from the main-lead full-thickness portion so as to cross the thickness direction.

7. The semiconductor device according to claim 6, wherein the first electrode overlaps with both the main-lead full-thickness portion and the main-lead eaved portion as viewed in the thickness direction.

8. The semiconductor device according to claim 6, wherein an entirety of the semiconductor element overlaps with the main-lead full-thickness portion as viewed in the thickness direction.

9. The semiconductor device according to claim 6, wherein the main-lead eaved portion includes a main-lead front portion projecting from the main-lead full-thickness portion toward the first sublead.

10. The semiconductor device according to claim 6, wherein an entirety of the main-lead full-thickness portion is surrounded by the main-lead eaved portion as viewed in the thickness direction.

11. The semiconductor device according to claim 6, wherein an entirety of the main-lead eaved portion overlaps with the semiconductor element as viewed in the thickness direction.

12. The semiconductor device according to claim 6, further comprising a main-lead obverse surface plating layer disposed between the semiconductor element and the main lead.

13. The semiconductor device according to claim 12, wherein the main-lead obverse surface plating layer overlaps with an entirety of the main-lead eaved portion.

14. The semiconductor device according to claim 1, wherein the first sublead has a first sublead obverse surface and a first sublead reverse surface that is exposed from the resin package,
the first sublead includes a first sublead full-thickness portion and a first sublead eaved portion, the first sublead full-thickness portion extending from the first sublead obverse surface to the first sublead reverse surface, the first sublead eaved portion projecting from the first sublead full-thickness portion so as to cross the thickness direction, the first sublead eaved portion forming a part of the first sublead obverse surface.

15. The semiconductor device according to claim 14, wherein the first sublead eaved portion includes a first sublead front portion projecting from the first sublead full-thickness portion toward the main lead.

16. The semiconductor device according to claim 14, wherein the first sublead includes a first sublead extension that extends from the first sublead full-thickness so as to cross the thickness direction, and that forms the first sublead reverse surface,
the first sublead extension has an end surface parallel to the thickness direction and exposed from the resin package.

17. The semiconductor device according to claim 1, wherein the first sublead has a first sublead obverse surface and a first sublead reverse surface, and the first sublead reverse surface is exposed from the first surface of the resin package.

18. The semiconductor device according to claim 17, wherein the first sublead reverse surface is flush with the first surface of the resin package.

19. The semiconductor device according to claim 17, wherein the first sublead includes a first sublead end surface connected to the first sublead reverse surface, and the first sublead end surface faces away from the main lead.

20. The semiconductor device according to claim 19, wherein the first sublead end surface is exposed from the resin package.

21. The semiconductor device according to claim 19, wherein the resin package has a resin end surface that is flush with the first sublead end surface.

22. The semiconductor device according to claim 19, wherein the second portion of the first sublead includes a first sublead side surface connected to the first sublead reverse surface, and the first sublead side surface faces in a direction perpendicular to both the direction in which the first sublead end surface faces and the thickness direction of the semiconductor element.

23. The semiconductor device according to claim 22, wherein the first sublead side surface is exposed from the resin package.

24. The semiconductor device according to claim 22, wherein the resin package has a resin side surface that is flush with the first sublead side surface.

25. The semiconductor device according to claim 1, further comprising a first sublead plating layer disposed between the first sublead and the first wire.

26. The semiconductor device according to claim 1, further comprising a second sublead electrically connected to the semiconductor element via the second wire and covered with the resin package, wherein the second sublead is spaced apart from the main lead and the first sublead and has a portion exposed from the resin package.

27. The semiconductor device according to claim 26, further comprising a second sublead plating layer disposed between the second sublead and the second wire.

28. The semiconductor device according to claim 1, wherein the semiconductor element comprises a semiconductor layer, a eutectic layer of semiconductor and metal, and a single metal layer, and the single metal layer is attached to the main lead.

29. The semiconductor device according to claim 28, wherein the eutectic layer is made of Si and Au.

30. The semiconductor device according to claim 29, wherein the single metal layer is thinner than the the eutectic layer.

31. The semiconductor device according to claim 1, wherein the main lead has a third portion exposed from the first surface and the first sublead has a fourth portion exposed from the first surface,
wherein the third portion is on a first side relative to a central line of the first surface, and the fourth portion is on a second side relative to the central line of the first surface, and
wherein the third portion and the fourth portion are different from each other in area measured in the first surface.

32. The semiconductor device according to claim 1, wherein the first portion and the second portion, respectively, have a first edge and a second edge that are perpendicular to the thickness direction, and the first edge and the second edge are in a same line.

* * * * *